(12) United States Patent
Miyoshi et al.

(10) Patent No.: US 7,365,537 B2
(45) Date of Patent: Apr. 29, 2008

(54) MR DATA ACQUISITION METHOD, MR IMAGE CONSTRUCTION METHOD, AND MRI SYSTEM

(75) Inventors: Mitsuharu Miyoshi, Tokyo (JP); Aki Yamazaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 89 days.

(21) Appl. No.: 11/049,485

(22) Filed: Feb. 1, 2005

(65) Prior Publication Data

US 2005/0179432 A1      Aug. 18, 2005

(30) Foreign Application Priority Data

Feb. 18, 2004   (JP)   ............... 2004-040695

(51) Int. Cl.
 *G01V 3/00*   (2006.01)
(52) U.S. Cl. ..................................... 324/307
(58) Field of Classification Search ........ 324/300–322; 600/410–435; 702/19–32, 85–91, 106, 124–126; 382/128–134, 266–275, 276–308, 320
See application file for complete search history.

(56) References Cited

U.S. PATENT DOCUMENTS

| 6,147,493 A | 11/2000 | Miyoshi |
| 6,466,016 B1 | 10/2002 | Miyoshi |
| 6,515,476 B1 | 2/2003 | Oshio et al. |
| 6,559,643 B2 | 5/2003 | Miyoshi |
| 6,597,172 B2 | 7/2003 | Miyoshi |
| 6,608,479 B1 | 8/2003 | Dixon et al. |
| 6,630,827 B1 | 10/2003 | Miyoshi et al. |
| 6,664,787 B2 | 12/2003 | Miyoshi et al. |
| 6,774,629 B2 | 8/2004 | Miyoshi |
| 6,814,280 B2 | 11/2004 | Miyoshi et al. |

FOREIGN PATENT DOCUMENTS

EP         0390175 A2      10/1990

(Continued)

OTHER PUBLICATIONS

Brian A. Hargreaves et al.; Fat-Suppressed Steady-State Free Precession Imaging Using Phase Detection; Magnetic Resonance in Medicine 50:210-213 (2003).

(Continued)

*Primary Examiner*—Brij Shrivastav
*Assistant Examiner*—Dixomara Vargas
(74) *Attorney, Agent, or Firm*—Armstrong Teasdale LLP

(57) ABSTRACT

An object of the present invention is to acquire data, which is used to construct a water component-enhanced/fat component-suppressed image, with a repetition time TR set to a desired value. Included are a data acquisition unit and an image construction unit. The data acquisition unit acquires data D_$\phi$fat according to a steady-state pulse sequence specifying that the phase of an RF pulse is varied in order of 0, 1×$\phi$fat, 2×$\phi$fat, etc. Herein, $\phi$fat=(2−TR/T_out+2×m)×$\pi$ is established on the assumption that m denotes an integer equal to or larger than 0 and meets TR/(2×T_out)−1<m<TR/(2×T_out) where TR denotes the repetition time and T_out denotes the time during which spins in water and spins in fat are out of phase with each other due to chemical shifts. The image construction unit constructs an MR image Gw using the data D_$\phi$fat.

16 Claims, 27 Drawing Sheets

FOREIGN PATENT DOCUMENTS

| | | |
|---|---|---|
| EP | 1271174 A2 | 1/2003 |
| JP | 04-352945 | 12/1992 |
| JP | 2003-052667 | 2/2003 |

OTHER PUBLICATIONS

Klaus Scheffler et al.; Magnetization Preparation During the Steady State: Fat-Saturated 3D TrueFISP; Magnetic Resonance in Medicine 45:1075-1080 (2001).

Shreyas S. Vasanawala et al.; Fluctuating Equilibrium MRI; Magnetic Resonance in Medicine 42:876-883 (1999).

Mitsuharu Miyoshi;Patent Application entitled MR Imaging Method and MRI System; 39 pgs.; Filed Feb. 1, 2005.

EP Partial Search Report; Place of Search The Hague; Reference No. 159564/10536; App No. 05250408.1-2209 PCT; 5 pgs.

Y. Zur et al.; Motion-Insensitive, Steady-State Free Precession Imaging; 8306 Magnetic Resonance in Medicine Dec. 16, 1990, No. 3, Duluth, MN; pp. 444-459.

Shreyas S. Vasanawala et al.; Linear Combination Steady-State Free Precession MRI; Magnetic Resonance in Medicine 43:82-90 (2000) pp. 82-90.

EP Complete Search Report; Place of Search The Hague; Reference No. 159564/10536; App No. 05250408.1-2209 PCT; 6 pgs.

A Japanese language Notice of Reasons for Rejection from the Japanese Patent Office.

FIG. 5

```
START image construction
         ↓
Construct MR image Gw using data D_φ fat  — B1
         ↓
        END
```

FIG. 6

TR = 0.5 × T_out    m = 0, φ fat = $\frac{3}{2}\pi$

| Change in the phase of an RF pulse |
|---|
| - 0 - $\frac{3}{2}\pi$ - $\frac{6}{2}\pi$ - $\frac{9}{2}\pi$ - 0 - $\frac{3}{2}\pi$ - |

|  | Echo induced by water | Echo induced by fat |
|---|---|---|
| D_φ fat | Ew, SE, GRE (triangle) | GRE, Ef, SE |
| Relative phase of a spine echo component    φ fat - π - φ chem | π / 2 | − π |
| Relative chemical shift    φ chem | 0 | φ fat |

FIG. 7

TR = 3.5 × T_out    m = 1, $\phi$ fat = $\frac{1}{2}\pi$

| Change in the phase of an RF pulse |
|---|
| - 0 - $\frac{1}{2}\pi$ - $\frac{2}{2}\pi$ - $\frac{3}{2}\pi$ - 0 - $\frac{1}{2}\pi$ - |

|  |  | Echo induced by water | Echo induced by fat |
|---|---|---|---|
| D_$\phi$ fat |  | GRE, Ew, SE (triangle) | GRE, Ef, SE |
| Relative phase of a spine echo component | $\phi$ fat - $\pi$ - $\phi$ chem | $-\pi/2$ | $-\pi$ |
| Relative chemical shift | $\phi$ chem | 0 | $\phi$ fat |

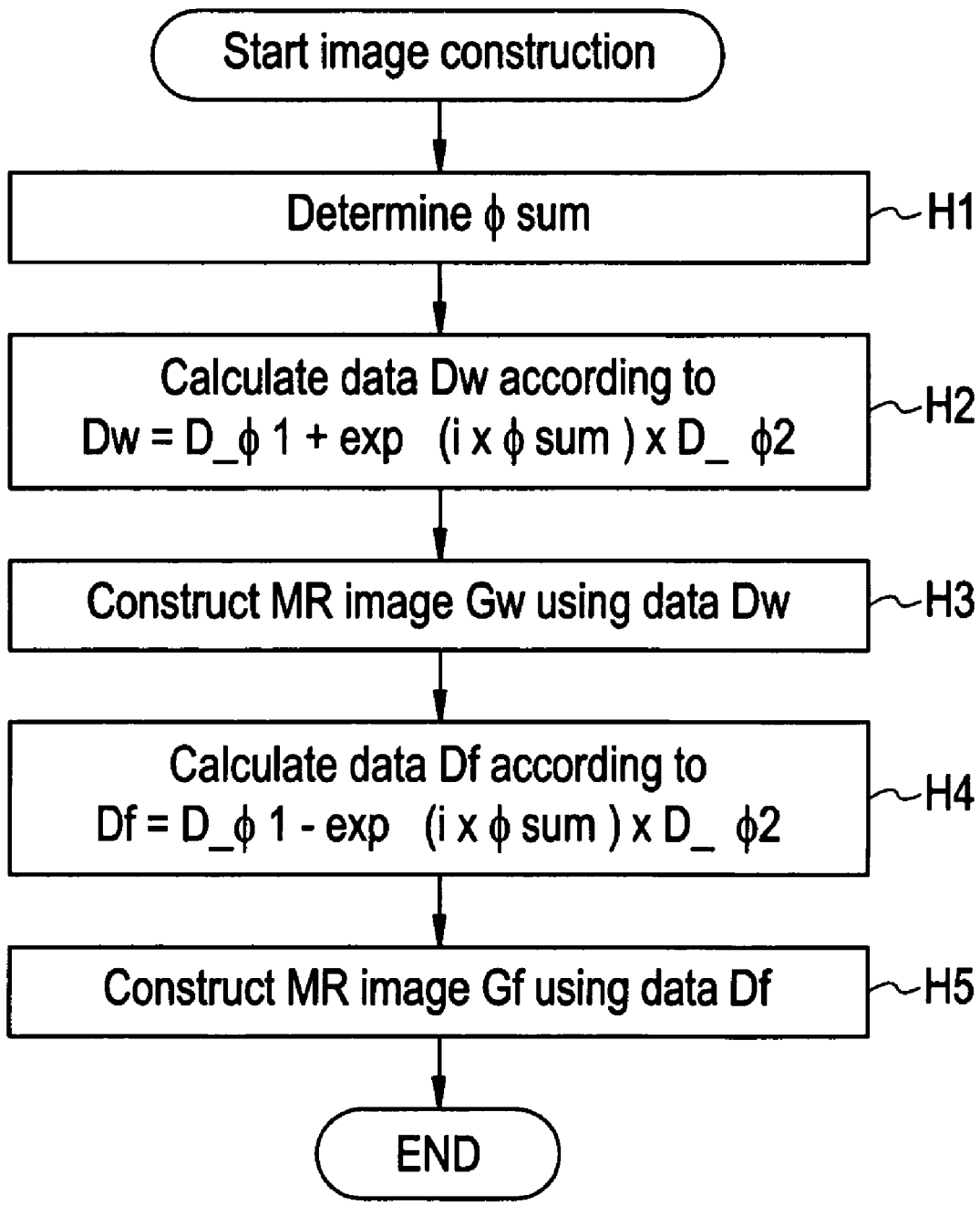

FIG. 13

$TR = 0.5 \times T\_out \quad m = 0, \phi\,fat = \frac{3}{2}\pi$ $\phi\,center = \phi\,fat = \frac{3}{2}\pi \quad \phi\,step = \frac{1}{4}\pi$ $\phi1 = \frac{7}{4}\pi$

| Change in the phase of an RF pulse |
|---|
| $-0-\frac{7}{4}\pi-\frac{14}{4}\pi-\frac{21}{4}\pi-\frac{28}{4}\pi-\frac{35}{4}\pi-\frac{42}{4}\pi-\frac{49}{4}\pi-0-\frac{7}{4}\pi-$ |

| | | Echo induced by water | Echo induced by fat |
|---|---|---|---|
| D_$\phi$1 | | 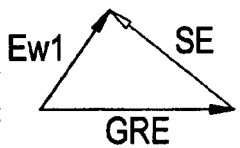 | 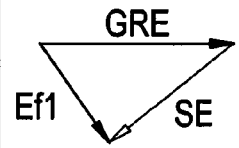 |
| Relative phase of a spine echo component | $\phi1 - \pi - \phi\,chem$ | $3\pi/4$ | $-3\pi/4$ |
| Relative chemical shift | $\phi\,chem$ | 0 | $\phi\,fat$ |

FIG. 14

$TR = 0.5 \times T\_out \quad m = 0, \phi\,fat = \frac{3}{2}\pi$ $\phi\,center = \phi\,fat = \frac{3}{2}\pi \quad \phi\,step = \frac{1}{4}\pi$ $\phi 2 = \frac{5}{4}\pi$

| Change in the phase of an RF pulse |
|---|
| $-0-\frac{5}{4}\pi-\frac{10}{4}\pi-\frac{15}{4}\pi-\frac{20}{4}\pi-\frac{25}{4}\pi-\frac{30}{4}\pi-\frac{36}{4}\pi-0-\frac{5}{4}\pi-$ |

| | | Echo induced by water | Echo induced by fat |
|---|---|---|---|
| $D\_\phi 2$ | | Ew2, SE, GRE | Ef2, SE, GRE |
| Relative phase of a spine echo component | $\phi 2 - \pi - \phi\,chem$ | $\pi/4$ | $3\pi/4$ |
| Relative chemical shift | $\phi\,chem$ | 0 | $\phi\,fat$ |

FIG. 15

| $\phi\text{ sum} = \phi\text{ step} = \frac{1}{4}\pi$ | Echo induced by water | Echo induced by fat |
|---|---|---|
| $\exp(i \times \phi\text{ sum}) \times D\_\phi 2$ | Ew2'  $\phi$ sum  Ew2 | $\phi$ sum  Ef2'  Ef2 |

FIG. 16

| | Echo induced by water | Echo induced by fat |
|---|---|---|
| Dw<br>$D\_\phi 1 + \exp(i \times \phi\text{ sum}) \times D\_\phi 2$ | EW  Ew2'  Ew1 | EF  Ef2'  Ef1 |
| Df<br>$D\_\phi 1 - \exp(i \times \phi\text{ sum}) \times D\_\phi 2$ | Ew2'  EW  Ew1 | Ef2'  EF  Ef1 |

FIG. 17

$TR = 3.5 \times T\_out \quad m = 1, \phi\,fat = \frac{1}{2}\pi$ $\phi\,center = \phi\,fat = \frac{1}{2}\pi \quad \phi\,step = \frac{1}{4}\pi$ $\phi 1 = \frac{3}{4}\pi$

| Change in the phase of an RF pulse |
|---|
| $-0 - \frac{3}{4}\pi - \frac{6}{4}\pi - \frac{9}{4}\pi - \frac{12}{4}\pi - \frac{15}{4}\pi - \frac{18}{4}\pi - \frac{21}{4}\pi - 0 - \frac{3}{4}\pi -$ |

| | | Echo induced by water | Echo induced by fat |
|---|---|---|---|
| D_$\phi$1 | | GRE, SE, Ew1 | GRE, Ef1, SE |
| Relative phase of a spine echo component | $\phi 1 - \pi - \phi\,chem$ | $-\pi/4$ | $-3\pi/4$ |
| Relative chemical shift | $\phi\,chem$ | 0 | $\phi\,fat$ |

FIG. 18

$TR = 3.5 \times T\_out \quad m = 1, \phi\, fat = \frac{1}{2}\pi$ $\phi\, center = \phi\, fat = \frac{1}{2}\pi \quad \phi\, step = \frac{1}{4}\pi$ $\phi 2 = \frac{1}{4}\pi$

| Change in the phase of an RF pulse |
|---|
| $- 0 - \frac{1}{4}\pi - \frac{2}{4}\pi - \frac{3}{4}\pi - \frac{4}{4}\pi - \frac{5}{4}\pi - \frac{6}{4}\pi - \frac{7}{4}\pi - 0 - \frac{1}{4}\pi -$ |

|  |  | Echo induced by water | Echo induced by fat |
|---|---|---|---|
| $D\_\phi 2$ | | 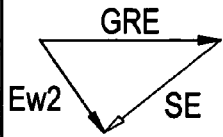 | 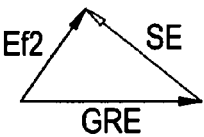 |
| Relative phase of a spine echo component | $\phi 2 - \pi - \phi\, chem$ | $-3\pi/4$ | $-5\pi/4$ |
| Relative chemical shift | $\phi\, chem$ | 0 | $\phi\, fat$ |

FIG. 19
| $\phi \text{ sum} = \phi \text{ step} = \frac{1}{4}\pi$ | Echo induced by water | Echo induced by fat |
|---|---|---|
| $\exp(i \times \phi \text{ sum}) \times D\_\phi 2$ | 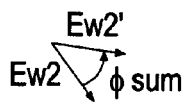 |  |
FIG. 20
| | Echo induced by water | Echo induced by fat |
|---|---|---|
| $Dw$<br>$D\_\phi 1 + \exp(i \times \phi \text{ sum}) \times D\_\phi 2$ | 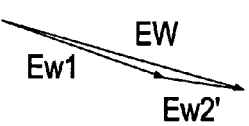 |  |
| $Df$<br>$D\_\phi 1 - \exp(i \times \phi \text{ sum}) \times D\_\phi 2$ | 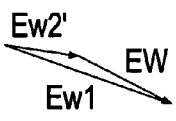 | 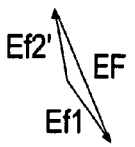 |

FIG. 21

$TR = 0.5 \times T\_out \quad m = 0, \phi \, fat = \frac{3}{2}\pi$ $\phi \, center = \pi + \frac{\phi \, fat}{2} - \phi \, step = \frac{5}{4}\pi \quad \phi \, step = \frac{1}{2}\pi$ $\phi 1 = \frac{7}{4}\pi$

| Change in the phase of an RF pulse |
|---|
| $-0-\frac{7}{4}\pi-\frac{14}{4}\pi-\frac{21}{4}\pi-\frac{28}{4}\pi-\frac{35}{4}\pi-\frac{42}{4}\pi-\frac{49}{4}\pi-0-\frac{7}{4}\pi-$ |

| | | Echo induced by water | Echo induced by fat |
|---|---|---|---|
| $D\_\phi 1$ | | Ew1, SE, GRE (triangle) | GRE, Ef1, SE (triangle) |
| Relative phase of a spine echo component | $\phi 1 - \pi - \phi \, chem$ | $3\pi/4$ | $-3\pi/4$ |
| Relative chemical shift | $\phi \, chem$ | 0 | $\phi \, fat$ |

FIG. 22

$TR = 0.5 \times T\_out \quad m = 0, \phi \text{ fat} = \frac{3}{2}\pi$ $\phi \text{ center} = \pi + \frac{\phi \text{ fat}}{2} - \phi \text{ step} = \frac{5}{4}\pi \quad \phi \text{ step} = \frac{1}{2}\pi$ $\phi 2 = \frac{3}{4}\pi$

| Change in the phase of an RF pulse |
|---|
| $- 0 - \frac{3}{4}\pi - \frac{6}{4}\pi - \frac{9}{4}\pi - \frac{12}{4}\pi - \frac{15}{4}\pi - \frac{18}{4}\pi - \frac{21}{4}\pi - 0 - \frac{3}{4}\pi -$ |

| | | Echo induced by water | Echo induced by fat |
|---|---|---|---|
| $D\_\phi 2$ | | 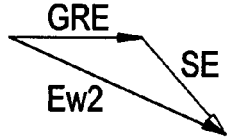 | 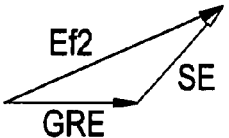 |
| Relative phase of a spine echo component | $\phi 2 - \pi - \phi \text{ chem}$ | $-\pi / 4$ | $-7\pi / 4$ |
| Relative chemical shift | $\phi \text{ chem}$ | 0 | $\phi \text{ fat}$ |

FIG. 23
| $\phi\text{ sum} = \phi\text{ step} = \frac{1}{2}\pi$ | Echo induced by water | Echo induced by fat |
|---|---|---|
| $\exp(i \times \phi\text{ sum}) \times D\_\phi 2$ | 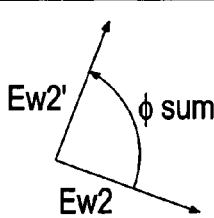 | 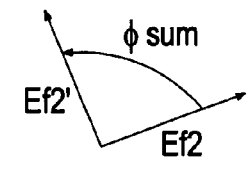 |
FIG. 24
| | Echo induced by water | Echo induced by fat |
|---|---|---|
| $Dw$<br>$D\_\phi 1 + \exp(i \times \phi\text{ sum}) \times D\_\phi 2$ | 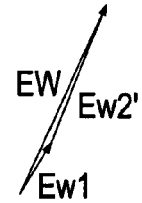 |  |
| $Df$<br>$D\_\phi 1 - \exp(i \times \phi\text{ sum}) \times D\_\phi 2$ | 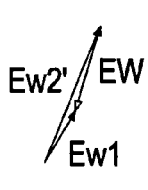 | 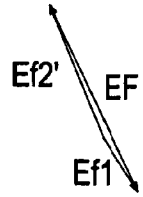 |

FIG. 25

$TR = 3.5 \times T\_out \quad m = 1, \phi\,fat = \frac{1}{2}\pi$ $\phi\,center = \pi \qquad \phi\,step = \frac{3}{4}\pi$ $\phi 1 = \frac{7}{4}\pi$

| Change in the phase of an RF pulse |
|---|
| $-0-\frac{7}{4}\pi-\frac{14}{4}\pi-\frac{21}{4}\pi-\frac{28}{4}\pi-\frac{35}{4}\pi-\frac{42}{4}\pi-\frac{49}{4}\pi-0-\frac{7}{4}\pi-$ |

|  |  | Echo induced by water | Echo induced by fat |
|---|---|---|---|
| D_$\phi$1 |  | 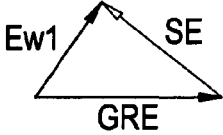 | 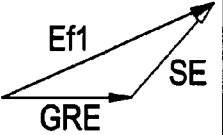 |
| Relative phase of a spine echo component | $\phi 1 - \pi - \phi\,chem$ | $3\pi/4$ | $\pi/4$ |
| Relative chemical shift | $\phi\,chem$ | 0 | $\phi\,fat$ |

FIG. 26

$TR = 3.5 \times T\_out \quad m = 1, \phi\,fat = \frac{1}{2}\pi$ $\phi\,center = \pi \qquad \phi\,step = \frac{3}{4}\pi$ $\phi 2 = \frac{1}{4}\pi$

| Change in the phase of an RF pulse |
|---|
| $-0-\frac{1}{4}\pi-\frac{2}{4}\pi-\frac{3}{4}\pi-\frac{4}{4}\pi-\frac{5}{4}\pi-\frac{6}{4}\pi-\frac{7}{4}\pi-0-\frac{1}{4}\pi-$ |

| | | Echo induced by water | Echo induced by fat |
|---|---|---|---|
| $D\_\phi 2$ | | 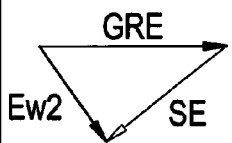 | 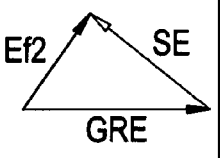 |
| Relative phase of a spine echo component | $\phi 2 - \pi - \phi\,chem$ | $-3\pi/4$ | $-5\pi/4$ |
| Relative chemical shift | $\phi\,chem$ | 0 | $\phi\,fat$ |

FIG. 27
| $\phi\,sum = \phi\,step = \frac{3}{4}\pi$ | Echo induced by water | Echo induced by fat |
|---|---|---|
| $\exp(i \times \phi\,sum) \times D\_\phi 2$ | 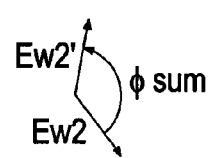 | 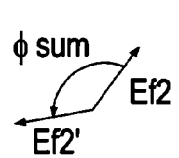 |
FIG. 28
| | Echo induced by water | Echo induced by fat |
|---|---|---|
| $D\_\phi 1 + \exp(i \times \phi\,sum) \times D\_\phi 2$ | 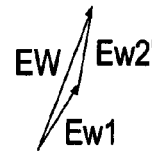 | 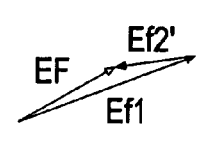 |
| $D\_\phi 1 - \exp(i \times \phi\,sum) \times D\_\phi 2$ | 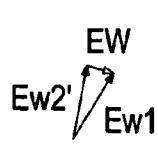 | 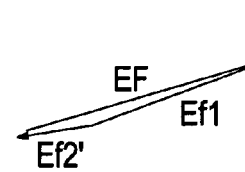 |

FIG. 31

TR = T_out $\phi 1 = \dfrac{3}{2}\pi$

| Change in the phase of an RF pulse |
|---|
| $- 0 - \dfrac{3}{2}\pi - \dfrac{6}{2}\pi - \dfrac{9}{2}\pi - 0 - \dfrac{3}{2}\pi -$ |

| | | Echo induced by water | Echo induced by fat |
|---|---|---|---|
| D_$\phi$1<br><br>D_$3\pi/2$ | | Ew1 / SE / GRE (triangle) | GRE, Ef1, SE (triangle) |
| Relative phase of a spine echo component | $\phi 1 - \pi - \phi$ chem | $\pi / 2$ | $-\pi / 2$ |
| Relative chemical shift | $\phi$ chem | 0 | $\pi$ |

FIG. 32
TR = T_out
$\phi 2 = \frac{1}{2}\pi$
| Change in the phase of an RF pulse |
|---|
| - 0 - $\frac{1}{2}\pi$ - $\frac{2}{2}\pi$ - $\frac{3}{2}\pi$ - 0 - $\frac{1}{2}\pi$ - |
|  |  | Echo induced by water | Echo induced by fat |
|---|---|---|---|
| D_$\phi$2<br><br>D_$\pi$/2 |  | 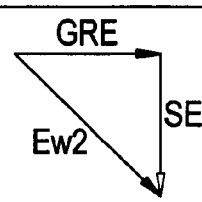 | 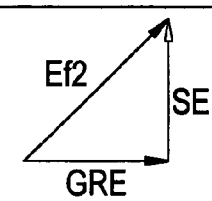 |
| Relative phase of a spine echo component | $\phi 2 - \pi - \phi$ chem | $-\pi/2$ | $-3\pi/2$ |
| Relative chemical shift | $\phi$ chem | 0 | $\pi$ |

FIG. 33

| | Echo induced by water | Echo induced by fat |
|---|---|---|
| $\exp(i \times \frac{\pi}{2}) \times D_{\_\phi}2$ | Ew2', Ew2, $\frac{\pi}{2}$ | $\frac{\pi}{2}$, Ef2', Ef2 |

FIG. 34

| | Echo induced by water | Echo induced by fat |
|---|---|---|
| Dw<br>$D_{\_\phi}1 + \exp(i \times \phi\text{sum}) \times D_{\_\phi}2$ | EW, Ew2', Ew1 | EF, Ef2', Ef1 |
| Df<br>$D_{\_\phi}1 - \exp(i \times \phi\text{sum}) \times D_{\_\phi}2$ | EW, Ew2', Ew1 | Ef2', EF, Ef1 |

US 7,365,537 B2

MR DATA ACQUISITION METHOD, MR IMAGE CONSTRUCTION METHOD, AND MRI SYSTEM

CROSS REFERENCE TO RELATED APPLICATIONS

This application claims the benefit of Japanese Application No. 2004-040695 filed Feb. 18, 2004.

BACKGROUND OF THE INVENTION

The present invention relates to a magnetic resonance (MR) data acquisition method, an MR image construction method, and a magnetic resonance imaging (MRI) system. More particularly, the present invention is concerned with an MR data acquisition method capable of acquiring data, which is used to construct a water component-enhanced/fat component-suppressed image or a fat component-enhanced/water component-suppressed image, with a repetition time TR set to a desired value, an MR image construction method for constructing the water component-enhanced/fat component-suppressed image or fat component-enhanced/water component-suppressed image using the data acquired according to the MR data acquisition method, and an MRI system in which the methods are preferably implemented.

In the steady-state free precession (SSFP) method in which an NMR signal is induced by the steady-state free precession of the transverse magnetization of spins, the fast imaging employed steady-state acquisition (FIESTA) method, or the fast imaging with steady-state free precession (True FISP) method, the fat saturation RF pulse method, the fluctuation equilibrium MR (FEMR) method, or the linear combination SSFP (LCSSFP) method is used in combination in order to construct a water component-enhanced image or a fat component-enhanced image.

According to the LCSSFP method, a repetition time TR is set to an out-of-phase time T_out during which spins in water and spins in fat are out of phase with each other due to chemical shifts. Data D_φ1 is acquired according to a steady-state pulse sequence (FIG. 29) stipulating that when φ1=3π/2 is established, the phase of an RF pulse is varied in order of 0×φ1, 1×φ1, 2×φ1, 3×φ1, etc. Data D_φ2 is acquired according to a steady-state pulse sequence (FIG. 30) stipulating that when φ2=π/2 is established, the phase of an RF pulse is varied in order of 0×φ2, 1×φ2, 2×+2, 3×φ2, etc. Data processing expressed as D_φ1+exp(i×π/2)×D_φ2 is performed in order to produce data Dw. The data Dw is used to construct a water component-enhanced/fat component-suppressed image Gw. Moreover, data processing expressed as D_φ1−exp(i×π/2)×D_φ2 is performed in order to produce data Df. The data Df is used to construct a fat component-enhanced/water component-suppressed image Gf (refer to, for example, Non-patent Document 1 or Patent Document 1).

[Non-patent Document 1] "Linear Combination Steady-state Free Precession MRI" written by Vasanawala et al. (Magnetic Resonance in Medicine, Vol. 43, 2000, pp. 82-90)

[Patent Document 1] Japanese Unexamined Patent Application Publication No. 2003-52667 ([0009] and [0010])

According to the LCSSFP method, the repetition time TR must be set to the out-of-phase time T_out. The out-of-phase time T_out depends on a magnetic field system. For example, when the magnetic field system offers a magnetic field strength of 0.2 T, the out-of-phase time is 20 ms. When the magnetic field strength is 0.35 T, the out-of-phase time is 10 ms. When the magnetic field strength is 0.7 T, the out-of-phase time is 5 ms. When the magnetic field strength is 1.5 T, the out-of-phase time is 2.3 ms.

However, for example, when the magnetic field system offers a magnetic field strength of 0.2 T, if the repetition time TR is set to 20 ms, it poses a problem in that a scan time gets long. On the other hand, for example, when the magnetic field system offers a magnetic field strength of 1.5 T, if the repetition time TR is set to 2.3 ms, hardware must incur a large load. Namely, the conventional LCSSFP method stipulates that the repetition time TR is set to the out-of-phase time T_out. The conventional LCSSFP method is therefore hardly implemented in a low-field strength system or a high-field strength system.

SUMMARY OF THE INVENTION

Therefore, an object of the present invention is to provide an MR data acquisition method capable of acquiring data, which is used to construct a water component-enhanced/fat component-suppressed image or a fat component-enhanced/water component-suppressed image, with a repetition time TR set to a desired value, an MR image construction method for constructing the water component-enhanced/fat component-suppressed image or fat component-enhanced/water component-suppressed image using the data acquired in the MR data acquisition method, and an MRI system in which the methods can be preferably implemented.

The method proposed in Patent Document 1 requires acquisition of data not only by varying the phase of an RF pulse in the same way as that in the LCSSFP method but also by varying the echo time TE ([0073] and [0074] in Patent Document 1).

In contrast, according to the present invention, the echo time TE need not be varied.

According to the first aspect of the present invention, there is provided an MR data acquisition method for acquiring data D_φfat according to a steady-state pulse sequence specifying that the phase of an RF pulse is varied in order of 0, 1×φfat, 2×φfat, etc. Herein, φfat=(2−TR/T_out+2×m)×π is establish assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts.

In the MR data acquisition method according to the first aspect, the data D_φfat to be used to construct a water component-enhanced/fat component-suppressed image Gw can be acquired with the repetition time TR set to a desired value.

According to the second aspect of the present invention, there is provided an MR data acquisition method for acquiring data D_φ1 according to a steady-state pulse sequence specifying that the phase of an RF pulse is varied in order of 0, 1×φ1, 2×φ1, etc., and acquiring data D_φ2 according to a steady-state pulse sequence specifying that the phase of an RF pulse is varied in order of 0, 1×φ2, 2×φ2, etc. Herein, φ1=φcenter+φstep and φ2=φcenter−φstep are established on the assumption that φcenter denotes a center phase, that is, a phase difference associated with the center of the portion of a line graph indicating a decrease in a signal strength, and that a phase width, that is, the width of the portion of the line graph indicating the decrease in a signal strength is 2×φstep (where any of 0<φcenter<π, −π<φcenter<0, 0<φstep<π/2, and π/2<φstep<π is met).

In the MR data acquisition method according to the second aspect, the data D_φ1 and data D_φ2 to be used to construct a water component-enhanced/fat component-suppressed image Gw or a fat component-enhanced/water component-suppressed image Gf can be acquired with the repetition time TR set to a desired value.

Incidentally, ϕcenter and ϕstep are experimentally set to practically optimal values with various theoretical optical values taken into consideration as indices.

According to the third aspect of the present invention, there is provided an MR data acquisition method, wherein: when ϕfat=(2−TR/T_out+2×m)×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, ϕcenter=ϕfat is established under the condition of 0<ϕstep≦π/2−|π−ϕfat|/2.

In the MR data acquisition method according to the third aspect, data D_ϕ1 and data D_ϕ2 to be used to construct a water component-enhanced/fat component-suppressed image Gw or a fat component-enhanced/water component-suppressed image Gf can be acquired with the repetition time TR set to a desired value.

According to the fourth aspect of the present invention, there is provided an MR data acquisition method, wherein: when ϕfat=(2−TR/T_out+2×m)×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, ϕcenter=ϕfat/2+ϕstep is established under the condition of ϕfat/2≦ϕstep≦π−ϕfat/2 as long as ϕfat≦π is met, or ϕcenter=π+ϕfat/2−ϕstep is established under the condition of π−ϕfat/2≦ϕstep≦ϕfat/2 as long as ϕfat≧π is met.

In the MR data acquisition method according to the fourth aspect, data D_ϕ1 and data D_ϕ2 to be used to construct a water component-enhanced/fat component-suppressed image Gw or a fat component-enhanced/water component-suppressed image Gf can be acquired with the repetition time TR set to a desired value.

According to the fifth aspect of the present invention, there is provided an MR data acquisition method, wherein: when ϕfat=(2−TR/T_out+2×m)×π is established on the assumption that m denotes an integer equal to or larger than 0 and meets TR/(2×T_out)=1<m<TR/(2×T_out) where TR denotes a repetition time and T_out denotes the time during which spins in water and spins in fat are out of phase with each other due to chemical shifts, ϕcenter=π is established under the condition of π/2+|π−ϕfat|/2≦ϕstep<π.

In the MR data acquisition method according to the fifth aspect, data D_ϕ1 and data D_ϕ2 to be used to construct a water component-enhanced/fat component-suppressed image Gw or a fat component-enhanced/water component-suppressed image Gf can be acquired with the repetition time TR set to a desired value.

According to the sixth aspect of the present invention, there is provided an MR data acquisition method in which ϕstep=π/2−/π−ϕfat|/2 is established.

According to the seventh aspect of the present invention, there is provided an MR data acquisition method in which ϕstep=π/2 and ϕcenter=ϕfat/2+π/2 are established.

According to the eighth aspect of the present invention, there is provided an MR data acquisition method in which ϕstep=π/2+|π−ϕfat|/2 is established.

According to the ninth aspect of the present invention, there is provided an MR image construction method for constructing an MR image Gw using data D_fat acquired according to the foregoing MR data acquisition method.

In the MR image construction method according to the ninth aspect, the water component-enhanced/fat component-suppressed, image Gw can be constructed.

According to the tenth aspect of the present invention, there is provided an MR image construction method for constructing an MR image Gw using data Dw. Herein, when data D_ϕ1 and data D_ϕ2 that are acquired according to the foregoing MR data acquisition method are synthesized with a phase value added to the data D_ϕ2 using ϕsum defined as 0<ϕsum<π, the data Dw is produced according to Dw=D_ϕ1+exp(i×ϕsum)×D_ϕ2.

In the MR image construction method according to the tenth aspect, the water component-enhanced/fat component-suppressed image Gw can be constructed.

Incidentally, ϕsum is experimentally set to a practically optimal value with theoretical optimal values taken into consideration as indices.

According to the eleventh aspect of the present invention, there is provided an MR image construction method in which ϕsum=ϕstep is established.

According to the twelfth aspect of the present invention, there is provided an MR image construction method for constructing an MR image Gf using data Df. Herein, when data D_ϕ1 and data D_ϕ2 that are acquired according to the aforesaid MR data acquisition method are synthesized with a phase value added to the data D_ϕ2 using ϕsum defined as 0<ϕsum<π, the data Df is produced according to Df=D_ϕ1−exp(i×ϕsum)×D_ϕ2.

In the MR image construction method according to the twelfth aspect, the fat component-enhanced/water component-suppressed image Gf can be constructed.

According to the thirteenth aspect of the present invention, there is provided an MR image construction method in which ϕsum=ϕstep is established.

According to the fourteenth aspect of the present invention, there is provided an MR image construction method in which a water component is enhanced.

According to the fifteenth aspect of the present invention, there is provided an MR image construction method in which a fat component is suppressed.

According to the sixteenth aspect of the present invention, there is provided an MR image construction method in which a fat component is enhanced.

According to the seventeenth aspect of the present invention, there is provided an MR image construction method in which a water component is suppressed.

According to the eighteenth aspect of the present invention, there is provided an MRI system comprising a data acquisition means that acquires data D_ϕfat according to a steady-state pulse sequence specifying that the phase of an RF pulse is varied in order of 0, 1×ϕfat, 2×ϕfat, etc. Herein, ϕfat=(2−TR/T_out+2×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts.

In the MRI system according to the eighteenth aspect, data D_ϕfat to be used to construct a water component-enhanced/fat component-suppressed image Gw can be acquired with the repetition time TR set to a desired value.

According to the nineteenth aspect of the present invention, there is provided an MRI system comprising a data acquisition means that acquires data D_ϕ1 according to a steady-state pulse sequence specifying that the phase of an RF pulse is varied in order of 0, 1×ϕ1, 2×+1, etc. and that acquires data D_ϕ2 according to a steady-state pulse sequence specifying that the phase of an RF pulse is varied in order of 0, 1×φ2, 2×φ2, etc. Herein, φ1=φcenter+φstep and φ2=φcenter−φstep are established on the assumption that φcenter denotes a center phase, that is, a phase difference associated with the center of the portion of a line graph indicating a decrease in a signal strength and that a phase width, that is, the width of the portion of the line graph indicating the decrease therein is defined as 2×φstep (where any of 0<φcenter<π, −π<φcenter<0, 0<φstep<π/2, and π/2<φstep<π is met).

In the MRI system according to the nineteenth aspect, data D_φ1 and data D_φ2 to be used to construct a water component-enhanced/fat component-suppressed image Gw or a fat component-enhanced/water component-suppressed image Gf can be acquired with the repetition time TR set to a desired value.

According to the twentieth aspect of the present invention, there is provided an MRI system, wherein when φfat=(2−TR/T_out+2×m)×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, φcenter=φstep is established under the condition of 0<φstep<π/2−|π−φfat|/2.

In the MRI system according to the twentieth aspect, data D_φ1 and data D_φ2 to be used to construct a water component-enhanced/fat component-suppressed image Gw or a fat component-enhanced/water component-suppressed image Gf can be acquired with the repetition time TR set to a desired value.

According to the twenty-first aspect of the present invention, there is provided an MRI system wherein when φfat=(2−TR/T_out+2×m)×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, φcenter=φfat/2+φstep is established under the condition of φfat/2≦φstep≦π−φfat/2 as long as φfat≦π is met, or φcenter=φfat/2−φstep is established under the condition of π−φfat/2≦φstep≦φfat/2 as long as φfat≧π is met.

In the MRI system according to the twenty-first aspect, data D_φ1 and data D_φ2 to be used to construct a water component-enhanced/fat component-suppressed image Gw or a fat component-enhanced/water component-suppressed image Gf can be acquired with the repetition time TR set to a desired value.

According to the twenty-second aspect of the present invention, there is provided an MRI system, wherein when φfat=(2−TR/T_out+2×m)×π is established on the assumption that m denotes an integer equal to or larger than 0 and meets TR/(2×T_out)−1<m<TR/(2×T_out) where TR denotes a repetition time and T_out denotes the time during which spins in water and spins in fat are out of phase with each other due to chemical shifts, φcenter=π is established under the condition of π/2+|π−φfat|/2≦φstep<π.

In the MRI system according to the twenty-second aspect, data D_φ1 and data D_φ2 to be used to construct a water component-enhanced/fat component-suppressed image Gw or a fat component-enhanced/water component-suppressed image Gf can be acquired with the repetition time TR set to a desired value.

According to the twenty-third aspect of the present invention, there is provided an MRI system in which φstep=π/2−|π−φfat|/2 is established.

According to the twenty-fourth aspect of the present invention, there is provided an MRI system in which φstep=π/2 and φcenter=φfat/2+π/2 are established.

According to the twenty-fifth aspect of the present invention, there is provided an MRI system in which φstep=π/2+|π−φfat|/2 is established.

According to the twenty-sixth aspect of the present invention, there is provided an MRI system in which the MRI system comprises an image construction means for constructing an MR image Gw using the data D_fat.

In an MR image construction method employed in the twenty-sixth aspect, the water component-enhanced/fat component-suppressed image Gw can be constructed.

According to the twenty-seventh aspect of the present invention, there is provided an MRI system in which the MRI system comprises an image construction means for constructing an MR image Gw using data Dw. Herein, when the data D_φ1 and data D_2 are synthesized with a phase value added to the data D_φ2 using φsum defined as 0<φsum<π, the data Dw is produced according to Dw=D_φ1+exp(i×φsum)×D_φ2.

In an MR construction method employed in the twenty-seventh aspect, the water component-enhanced/fat component-suppressed image Gw can be constructed.

According to the twenty-eighth aspect of the present invention, there is provided an MRI system in which φsum=φstep is established.

According to the twenty-ninth aspect of the present invention, there is provided an MRI system in which the MRI system comprises an image construction means for constructing an MR image Gf using data Df. Herein, when the data D_φ1 and data D_φ2 are synthesized with a phase value added to the data D_φ2 using φsum defined as 0<φsum<π, the data Df is produced according to Df=D_φ1−exp(i×φsum)×D_φ2.

In an MR construction method employed in the twenty-ninth aspect, the fat component-enhanced/water component-suppressed image Gf can be constructed.

According to the thirtieth aspect of the present invention, there is provided an MRI system in which φsum=φstep is established.

According to the thirty-first aspect of the present invention, there is provided an MRI system in which a water component is enhanced.

According to the thirty-second aspect of the present invention, there is provided an MRI system in which a fat component is suppressed.

According to the thirty-third aspect of the present invention, there is provided an MRI system in which a fat component is enhanced.

According to the thirty-fourth aspect of the present invention, there is provided an MRI system in which a water component is suppressed.

According to an MR data acquisition method of the present invention, data to be used to construct a water component-enhanced/fat component-suppressed image or a fat component-enhanced/water component-suppressed image can be acquired with the repetition time TR set to a desired value.

According to an MR image construction method of the present invention, the water component-enhanced/fat component-suppressed image or fat component-enhanced/water component-suppressed image can be constructed using the data acquired according to the MR data acquisition method in accordance with the present invention.

According to an MRI system of the present invention, the data to be used to construct the water component-enhanced/ fat component-suppressed image or fat component-enhanced/water component-suppressed image can be acquired with the repetition time TR set to a desired value. Moreover, the water component-enhanced/fat component-suppressed image or fat component-enhanced/water component-suppressed image can be constructed.

An MR data acquisition method, an MR image construction method, and an MRI system in accordance with the present invention can be utilized for construction of a water component-enhanced/fat component-suppressed image or a fat component-enhanced/water component-suppressed image.

Further objects and advantages of the present invention will be apparent from the following description of the preferred embodiments of the invention as illustrated in the accompanying drawings.

BRIEF DESCRIPTION OF THE DRAWINGS

FIG. 5 is a flowchart describing image construction employed in the first embodiment.

FIG. 6 is an explanatory diagram conceptually expressing the principles of the first embodiment.

FIG. 7 is an explanatory diagram conceptually expressing the principles of the second embodiment.

FIG. 12 is a flowchart describing image construction employed in the third embodiment.

FIG. 13 is a conceptual explanatory diagram showing the nature of data acquired according to the first steady-state pulse sequence employed in the third embodiment.

FIG. 14 is a conceptual explanatory diagram showing the nature of data acquired according to the second steady-state pulse sequence employed in the third embodiment.

FIG. 15 is a conceptual explanatory diagram showing rotation of the phases of echoes represented by the data acquired according to the second steady-state pulse sequence employed in the third embodiment.

FIG. 16 is an explanatory diagram conceptually showing the principles of the third embodiment.

FIG. 17 is a conceptual explanatory diagram showing the nature of data acquired according to a first steady-state pulse sequence employed in the fourth embodiment.

FIG. 18 is a conceptual explanatory diagram showing the nature of data acquired according to a second steady-state pulse sequence employed in the fourth embodiment.

FIG. 19 is a conceptual explanatory diagram showing rotation of the phases of echoes represented by the data acquired according to the second steady-state pulse sequence employed in the fourth embodiment.

FIG. 20 is an explanatory diagram conceptually showing the principles of the fourth embodiment.

FIG. 21 is a conceptual explanatory diagram showing the nature of data acquired according to a first steady-state pulse sequence employed in the fifth embodiment.

FIG. 22 is a conceptual explanatory diagram showing the nature of data acquired according to a second steady-state pulse sequence employed in the fifth embodiment.

FIG. 23 is a conceptual explanatory diagram showing rotation of the phases of echoes represented by the data acquired according to the second steady-state pulse sequence employed in the fifth embodiment.

FIG. 24 is an explanatory diagram conceptually showing the principles of the fifth embodiment.

FIG. 25 is a conceptual explanatory diagram showing the nature of data acquired according to a first steady-state pulse sequence employed in the sixth embodiment.

FIG. 26 is a conceptual explanatory diagram showing the nature of data acquired according to a second steady-state pulse sequence employed in the sixth embodiment.

FIG. 27 is a conceptual explanatory diagram showing rotation of the phases of echoes represented by the data acquired according to the second steady-state pulse sequence employed in the sixth embodiment.

FIG. 28 is an explanatory diagram conceptually showing the principles of the sixth embodiment.

FIG. 31 is a conceptual explanatory diagram showing the nature of data acquired according to the first steady-state pulse sequence employed in the related art.

FIG. 32 is a conceptual explanatory diagram showing the nature of data acquired according to the second steady-state pulse sequence employed in the related art.

FIG. 33 is a conceptual explanatory diagram showing rotation of the phases of echoes represented by the data acquired according to the second steady-state pulse sequence employed in the related art.

FIG. 34 is an explanatory diagram conceptually showing the principles of the related art.

DETAILED DESCRIPTION OF THE INVENTION

The present invention will be further described below by taking illustrated embodiments for instance. Noted is that the present invention will not be limited to the embodiments.

Prior to description of embodiments, a conceptual model will be presented for explanation of the principles of the present invention.

Data D_φ acquired according to a steady-state pulse sequence specifying that the phase of an RF pulse is varied in order of 1×φ, 1×φ, 2×φ, 3×φ, etc. originates from an echo Ew induced by water and an echo Ef induced by fat. The echo Ew induced by water is a synthesis of a gradient echo GRE and a spin echo SE which are induced by water. The gradient echo component leads the spin echo component by φ−σ. On the other hand, the echo Ef induced by fat is a synthesis of a gradient echo and a spin echo which are induced by fat. The gradient echo component leads the spin echo component by φ−π−φfat. Herein, φfat denotes a phase by which the spin echo component of an echo induced by water leads the spin echo component of an echo induced by water in a steady state due to chemical shifts. For generalization, the spin echo component shall lead the gradient echo component by $\phi-\pi-\phi$chem irrespective of whether they are the components of an echo induced by water or fat. For the spin echo component of an echo induced by water, $\phi$chem shall be equal to 0. For the spin echo component of an echo induced by fat, $\phi$chem shall be equal to $\phi$fat.

Figure 29:
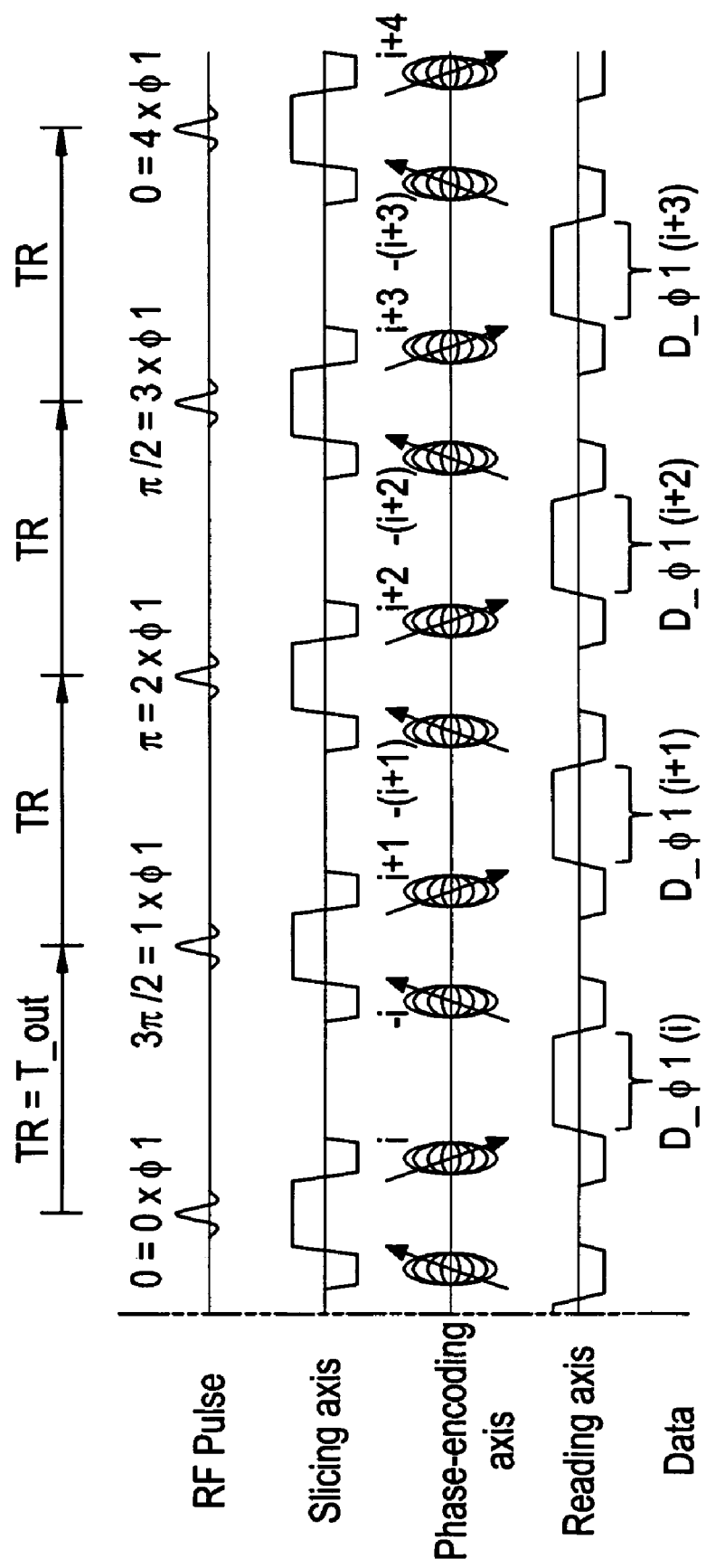
FIG. 29 is an explanatory diagram showing a first steady-state pulse sequence employed in a related art.

The foregoing conceptual model is adapted to data $D\_\phi1$ acquired according to a steady-state pulse sequence specifying $\phi1=3\pi/2$ as shown in FIG. 29. In this case, as shown in FIG. 31, the spin echo component of an echo Ew1 induced by water leads the gradient echo component thereof by $\pi/2$. As for an echo Ef1 induced by fat, the spin echo component of the echo leads the gradient echo component thereof by $-\pi/2$.

Figure 30:
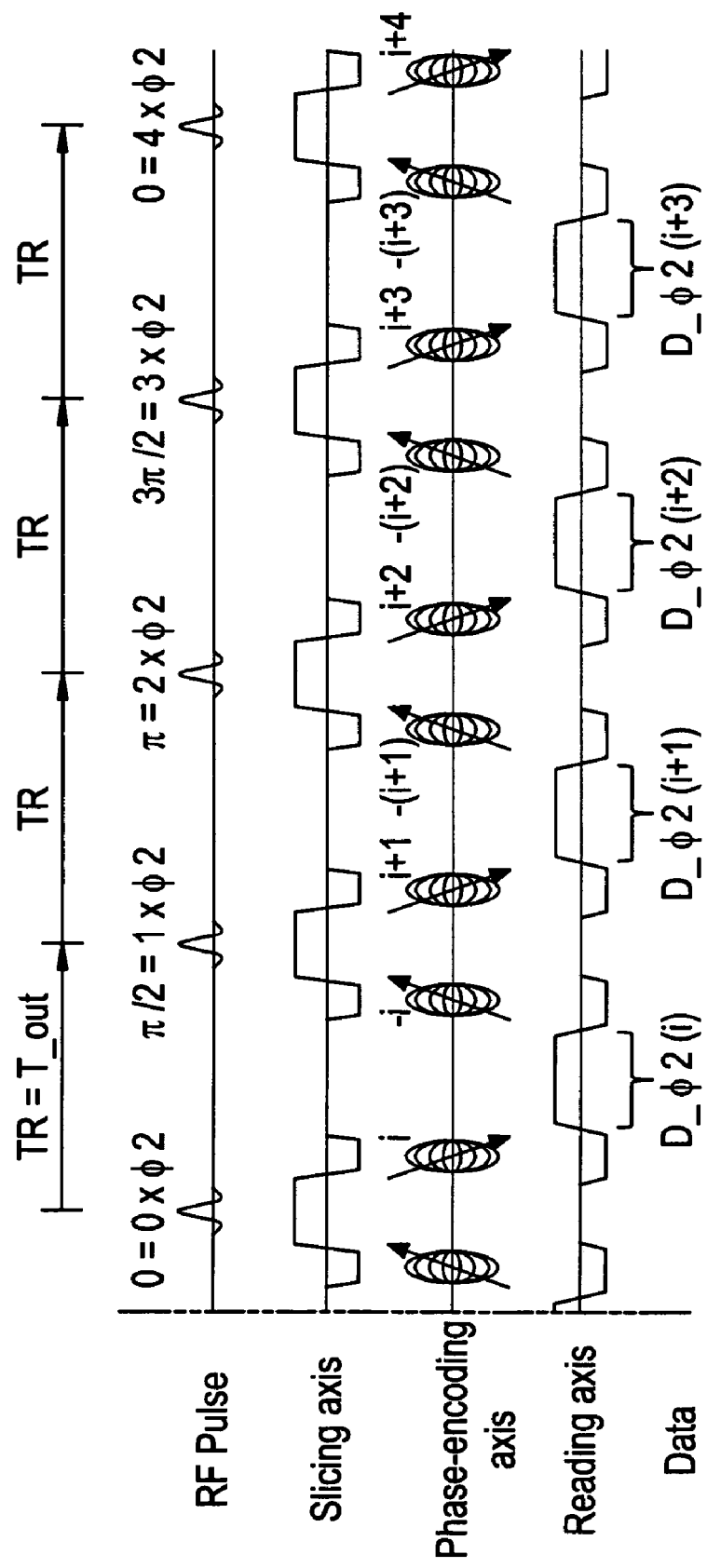
FIG. 30 is an explanatory diagram showing a second steady-state pulse sequence employed in the related art.

Moreover, the foregoing conceptual model is adapted to data $D\_\phi2$ acquired according to a steady-state pulse sequence specifying $\phi2=\pi/2$ as shown in FIG. 30. In this case, as shown in FIG. 32, the spin echo component of an echo Ew2 induced by water leads the gradient echo thereof by $-\pi/2$. As for an echo Ef2 induced by fat, the spin echo component of the echo leads the gradient echo component thereof by $-3\pi/2$.

As shown in FIG. 33, $\exp(i\times\pi/2)\times D\_\phi2$ signifies that the echo Ew2 induced by water is rotated by $\pi/2$ in order to produce an echo Ew2' and that the echo Ef2 induced by fat is rotated by $\pi/2$ in order to produce an echo Ef2'.

Consequently, as shown in FIG. 34, data processing expressed as $Dw=D\_\phi1+\exp(i\times\pi/2)\times D\_\phi2$ signifies that the echo Ew1 induced by water and the echo Ew2' are added up and the echo Ef1 induced by fat and the echo Ef2' are added up. Eventually, after the addition is completed, the resultant echo Ew induced by water is enhanced and the resultant echo Ef induced by fat is suppressed.

On the other hand, as shown in FIG. 34, data processing expressed as $Df=D\_\phi1-\exp(i\times\pi/2)\times D\_\phi2$ signifies that the echo Ew2' is subtracted from the echo Ew1 induced by water and the echo Ef2' is subtracted from the echo Ef1 induced by fat. Eventually, after the subtraction is completed, the resultant echo Ew induced by water is suppressed and the resultant echo Ef induced by fat is enhanced.

As mentioned above, according to the LCSSFP method, a water component-enhanced/fat component-suppressed image Gw can be constructed using data Dw and a fat component-enhanced/water component-suppressed image Gf can be constructed using data Df.

Figure 35:
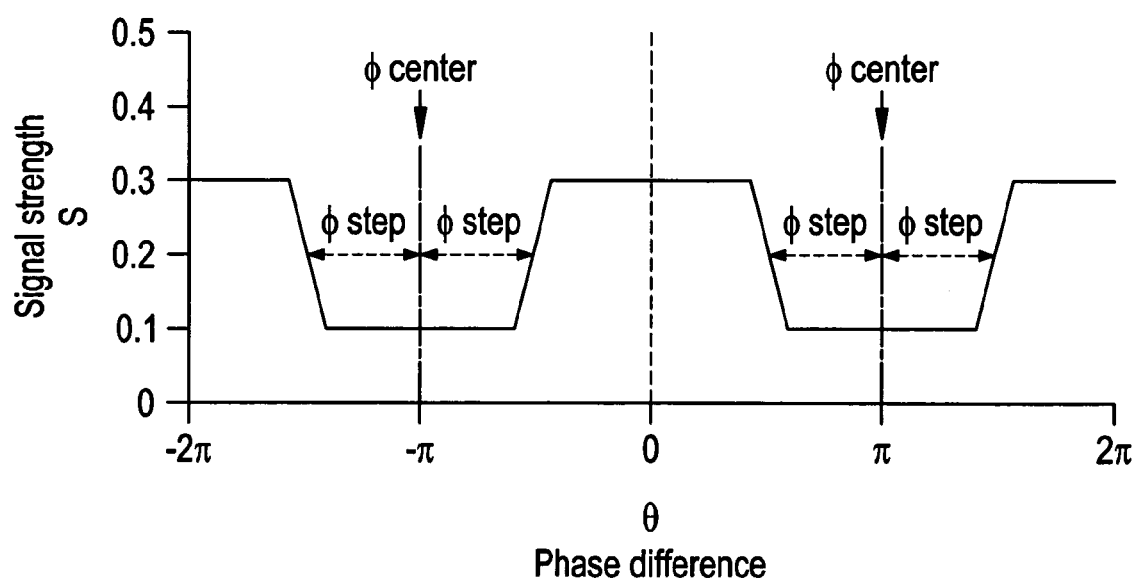
FIG. 35 is an explanatory diagram expressing φcenter and φstep employed in the related art.

Incidentally, FIG. 35 shows a change in a signal strength S in association with a change in a phase difference $\theta$ by which the spin echo component of an echo induced by fat leads the spin echo component of an echo induced by water.

The phase difference associated with the center of the portion of a line graph indicating a decrease in the signal strength S shall be defined as a center phase $\phi$center, and the center phase $\phi$center is set to $\pi$. The width of the portion of the line graph indicating the decrease therein shall be defined as a phase width $\phi$step, and the half of the phase width $\phi$step is set to $\pi/2$. The relationships of $\phi$center$=(\phi1+\phi2)/2$ and $\phi$step$=(\phi1-+2)/2$ are established.

First Embodiment

Figure 1:
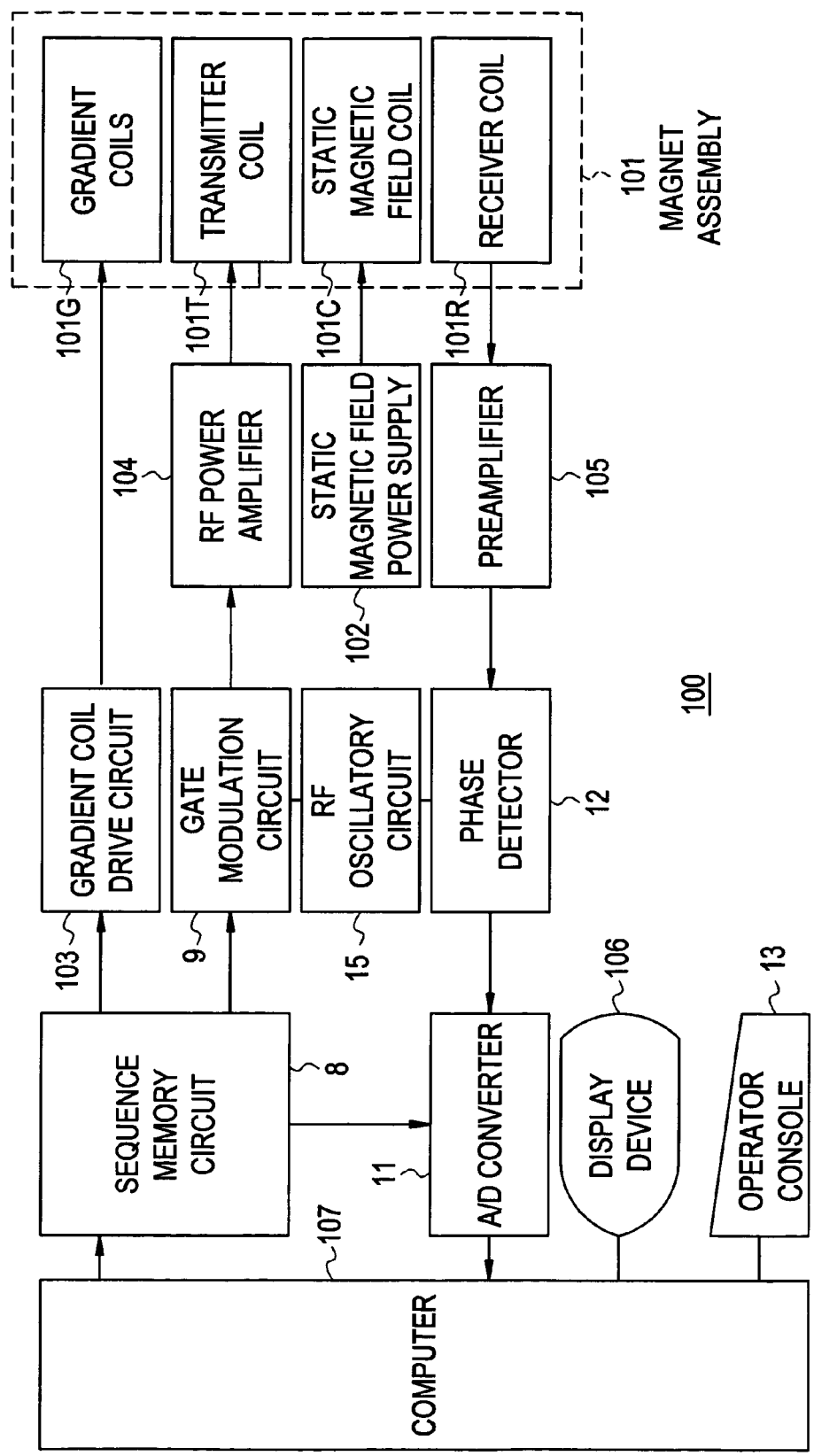
FIG. 1 is a block diagram showing the configuration of an MRI system in accordance with the first embodiment.

FIG. 1 is a block diagram showing an MRI system 100 in accordance with the first embodiment.

In the MRI system 100, a magnet assembly 101 has a bore into which a subject is inserted. A static magnetic field coil 101C for applying a constant static magnetic field to the subject, gradient coils 101G for producing magnetic field gradients whose directions coincide with the directions of X, Y, and Z axes (that serve as a slicing axis, a phase-encoding axis, and a reading axis), a transmitter coil 101T for applying RF pulses for excitation of spins of nuclei in the subject's body, and a receiver coil 101R for detecting NMR signals induced by the subject. The static magnetic field coil 101C, gradient coils 101G, transmitter coil 101T, and receiver coil 101R are connected to a static magnetic field power supply 102, a gradient coil drive circuit 103, an RF power amplifier 104, and a preamplifier 105 respectively.

Incidentally, a permanent magnet may be substituted for the static magnetic field coil 101C.

A sequence memory circuit 8 activates the gradient coil drive circuit 103 according to a stored pulse sequence in response to a command issued from a computer 107. This causes the gradient coils 101G included in the magnet assembly 101 to produce magnetic field gradients. Moreover, the sequence memory circuit 8 activates a gate modulation circuit 9 for modulation of a carrier-wave output signal of an RF oscillatory circuit 15 into a pulsating signal that exhibits a predetermined timing, a predetermined envelope, and a predetermined phase. The pulsating signal is applied as RF pulses to the RF power amplifier 104. After the power of the RF pulses is amplified by the RF power amplifier 104, the RF pulses are applied to the transmitter coil 101T included in the magnet assembly 101.

The preamplifier 105 amplifies NMR signals received from the subject by the receiver coil 101R included in the magnet assembly 101, and transfers the resultant NMR signals to a phase detector 12. The phase detector 12 detects the phases of the NMR signals sent from the preamplifier 105 using the carrier-wave output signal of the RF oscillatory circuit 15 as a reference signal, and transfers the signals to an A/D converter 11. The A/D converter 11 converts the signals, which have the phases thereof detected, from an analog form to a digital form, and transfers the resultant signals to the computer 107.

The computer 107 is responsible for overall control and receives information entered at an operator console 13. Moreover, the computer 107 reads digital data from the A/D converter 11, and performs computation on the digital data to construct an image.

An image and a message are displayed on a display device 106.

Figure 2:
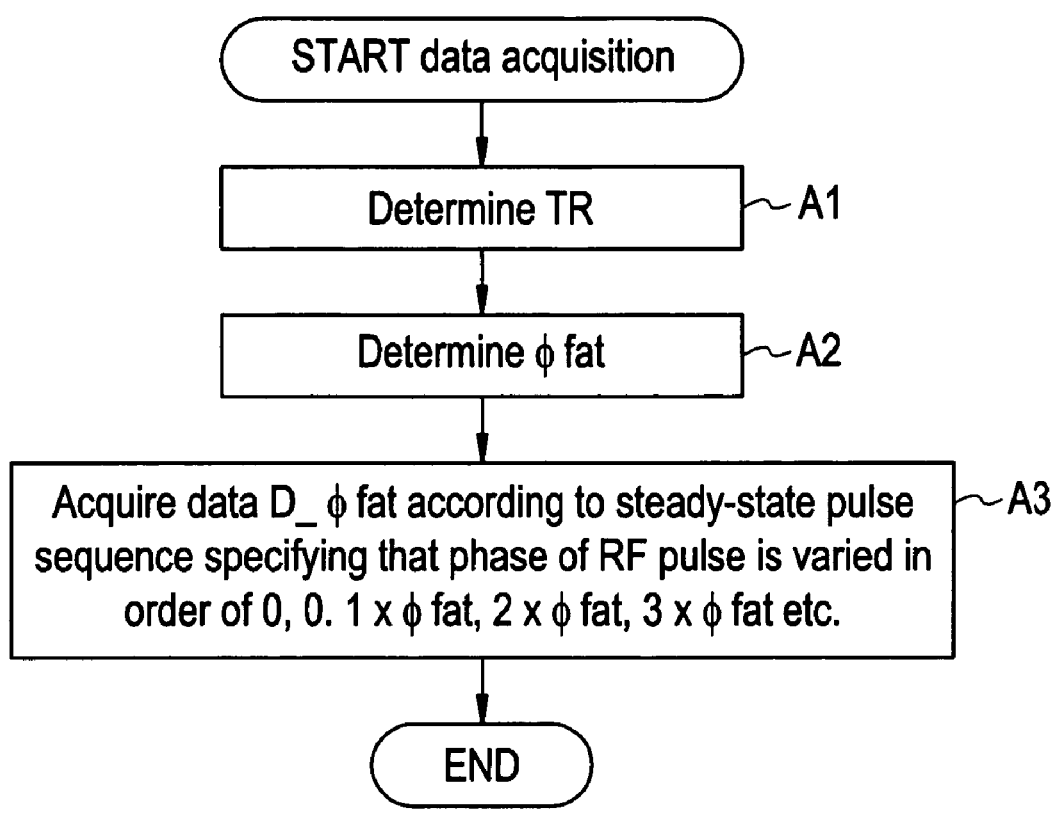
FIG. 2 is a flowchart describing data acquisition employed in the first embodiment.

FIG. 2 is a flowchart describing data acquisition employed in the first embodiment.

At step A1, the computer 107 determines a repetition time TR. For example, the options for the repetition time TR are displayed on the display device 106, and an operator is prompted to select any of the options. Herein, a magnetic field system shall offer a magnetic field strength of 0.2 T and the repetition time TR shall be set to 10 ms.

At step A2, $\phi$fat is determined according to $\phi$fat$=(2-TR/T\_out+2\times m)\times\pi$ where m denotes an integer equal to or larger than 0 and meets $TR/(2\times T\_out)-1<m<TR/(2\times T\_out)$. Herein, T_out denotes the time during which spins in water and spins in fat are out of phase with each other due to chemical shifts.

When the magnetic field system offers a magnetic field strength of 0.2 T, T_out is 20 ms. Therefore, if the repetition time TR is 10 ms, m equals 0 and $\phi$fat equals $3\pi/2$.

Figure 3:
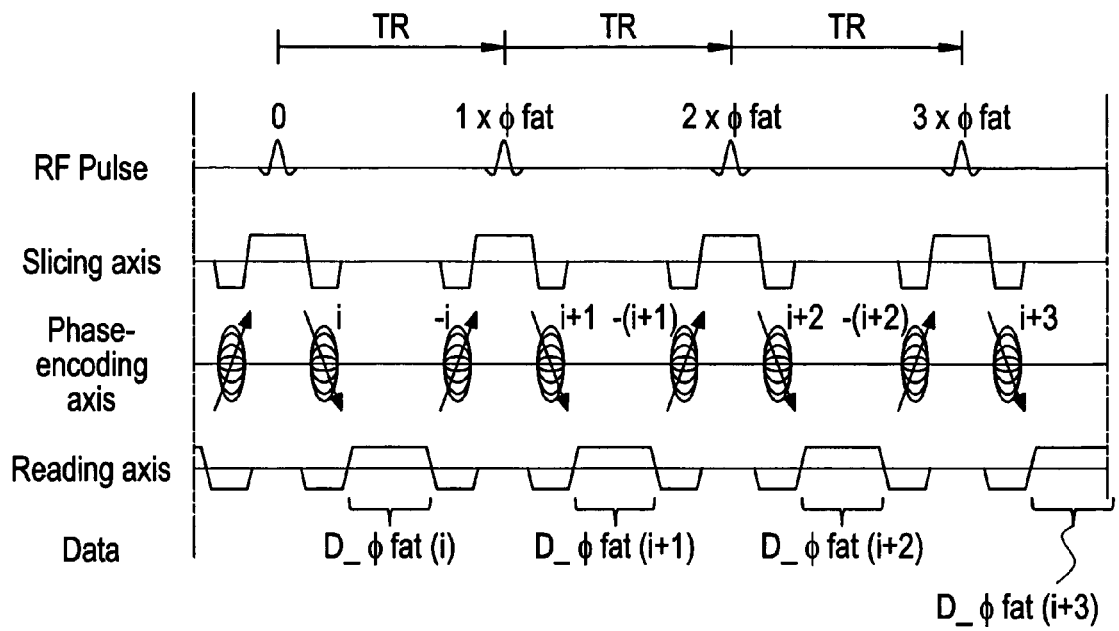
FIG. 3 is an explanatory diagram showing a normal steady-state pulse sequence employed in the first embodiment.
Figure 4:
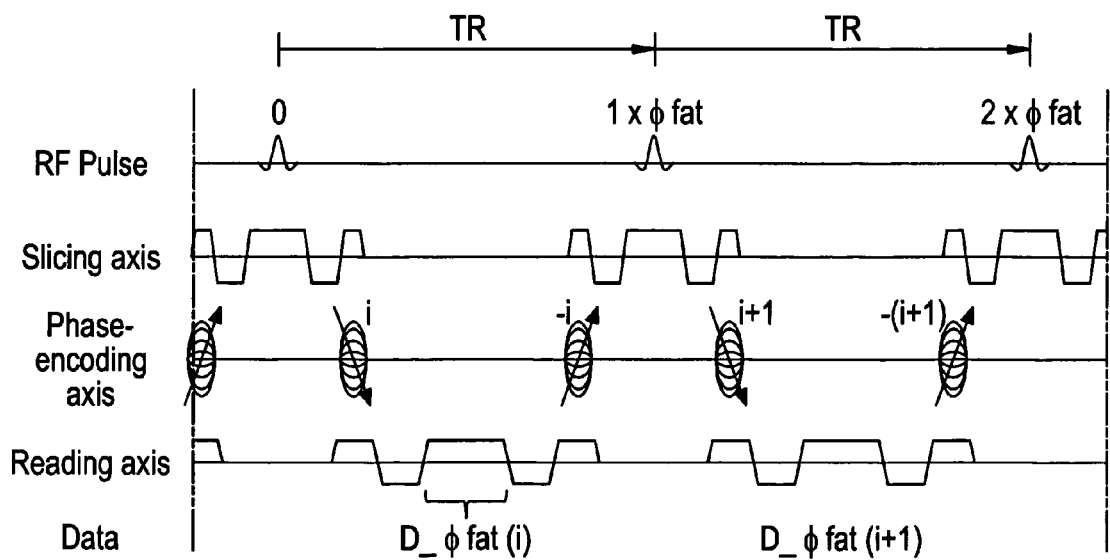
FIG. 4 is an explanatory diagram showing a steady-state pulse sequence devised in consideration of flow compensation and employed in the first embodiment.

At step A3, as shown in FIG. 3 or FIG. 4, data $D\_\phi$fat is acquired according to a steady-state pulse sequence specifying that the phase of an RF pulse is varied in order of 0, $1\times\phi$fat, $2\times\phi$fat, etc.

FIG. 3 shows a normal steady-state pulse sequence, and FIG. 4 shows a steady-state pulse sequence determined in consideration of flow compensation.

Thereafter, data acquisition is terminated.

FIG. 5 is a flowchart describing image construction employed in the first embodiment.

At step B1, the computer 107 constructs an image Gw using data D_φfat.

Then, image construction is terminated.

FIG. 6 is an explanatory diagram concerning the aforesaid conceptual model adapted to the data D_φfat acquired according to the steady-state pulse sequence specifying φfat=3π/2 as shown in FIG. 3 or FIG. 4.

The spin echo component of an echo Ew induced by water leads the gradient echo component thereof by π/2. The spin echo component of an echo Ef induced by fat leads the gradient echo component thereof by −π.

Consequently, the echo Ew induced by water is enhanced but the echo Ef induced by fat is suppressed.

Eventually, a water component-enhanced/fat component-suppressed image Gw can be constructed using the data D_φfat.

Second Embodiment

The second embodiment is fundamentally identical to the first embodiment. However, a magnetic field system shall offer a magnetic field strength of 1.5 T and the repetition time TR shall be set to 8.05 ms.

In this case, as shown in FIG. 7, m equals 1 and φfat equals π/2.

The spin echo component of an echo Ew induced by water leads the gradient echo component thereof by −π/2. The spin echo component of an echo Ef induced by fat leads the gradient echo component thereof by −π.

Consequently, the echo Ew induced by water is enhanced and the echo Ef induced by fat is suppressed.

Eventually, a water component-enhanced/fat component-suppressed image Gw can be constructed using the data D_φfat.

Third Embodiment

Figure 8:
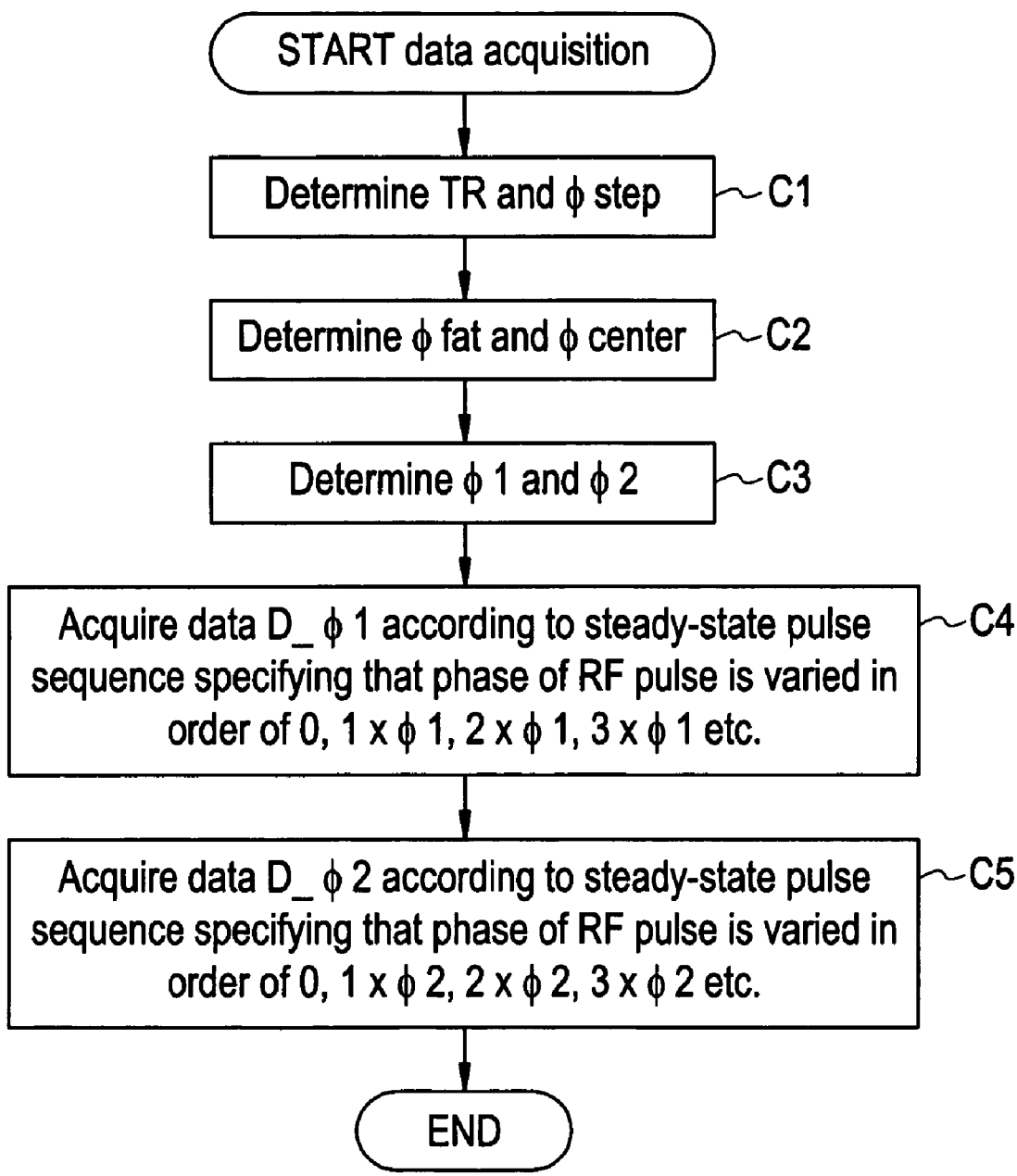
FIG. 8 is a flowchart describing data acquisition employed in the third embodiment.

FIG. 8 is a flowchart describing data acquisition employed in the third embodiment.

At step C1, the computer 107 determines the repetition time TR and φstep. For example, the options for the repetition time TR and the options for φstep are displayed on the display device 106, and an operator is prompted to select any of the options. φstep denotes a half of a phase width, that is, a half of the width of the portion of a line graph indicating a decrease in a signal strength S. Herein, the line graph expresses a change in the signal strength S in association with a change in a phase θ by which the spin echo component of an echo induced by water leads the spin echo component of an echo induced by fat.

Herein, a magnetic field system shall offer a magnetic field strength of 0.2 T, the repetition time TR shall be set to 10 ms, and φstep shall be set to π/4.

At step C2, φfat is determined according to φfat=(2−TR/T_out+2×m)×π where m denotes an integer equal to or larger than 0 and meets TR/(2×T_out)−1<m<TR/(2×T_out). Herein, T_out denotes the time during which spins in water and spins in fat are out of phase with each other due to chemical shifts.

Figure 9:
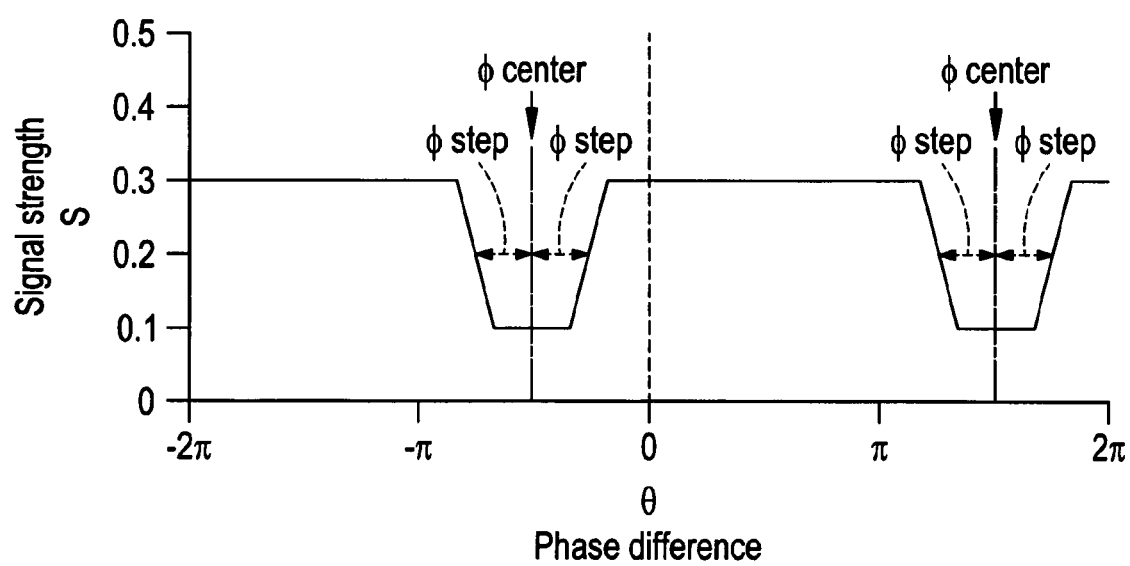
FIG. 9 is an explanatory diagram indicating φcenter and φstep.

Moreover, φcenter is determined. φcenter denotes, as shown in FIG. 9, a center phase, that is, a phase difference associated with the center of the portion of a line graph indicating a decrease in a signal strength S. Herein, the line graph expresses a change in the signal strength S in association with a change in a phase difference θ by which the spin echo component of an echo induced by fat leads the spin echo component of an echo induced by water.

However, any of 0<φcenter<π, −π<φcenter<0, 0<φstep<π/2, and π/2<φstep<π shall be met.

Herein, the magnetic field system shall offer a magnetic field strength of 0.2 T and T_out shall be 20 ms. Assuming that the repetition time TR is 10 ms, m equals 0 and φfat equals 3π/2.

Moreover, φcenter=φfat=3π/2 shall be established.

At step C3, φ1 and φ2 are determined according to φ1=φcenter+φstep and φ2=φcenter−φstep respectively.

Herein, since φcenter equals 3π/2 and φstep equals π/4, φ1 comes to 7π/4 and φ2 comes to 5π/4.

Figure 10:
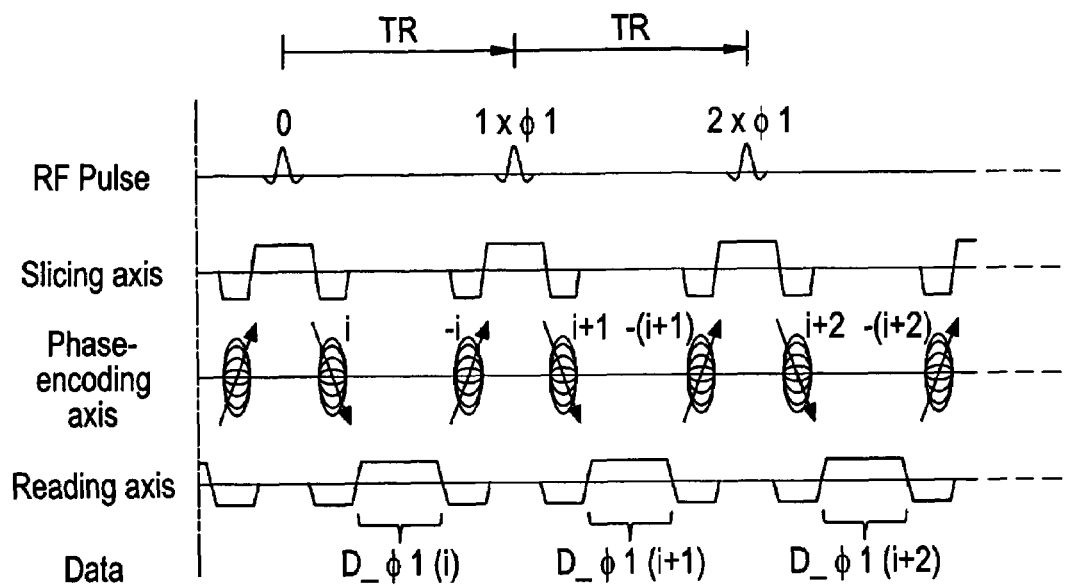
FIG. 10 is an explanatory diagram showing a first steady-state pulse sequence employed in the third embodiment.

At step C4, as shown in FIG. 10, data D_φ1 is acquired according to a steady-state pulse sequence specifying that the phase of an RF pulse is varied in order of 0, 1×φ1, 2×φ1, etc. Incidentally, FIG. 10 shows a normal steady-state pulse sequence. A steady-state pulse sequence determined in consideration of flow compensation may be substituted for the normal steady-state pulse sequence.

Figure 11:
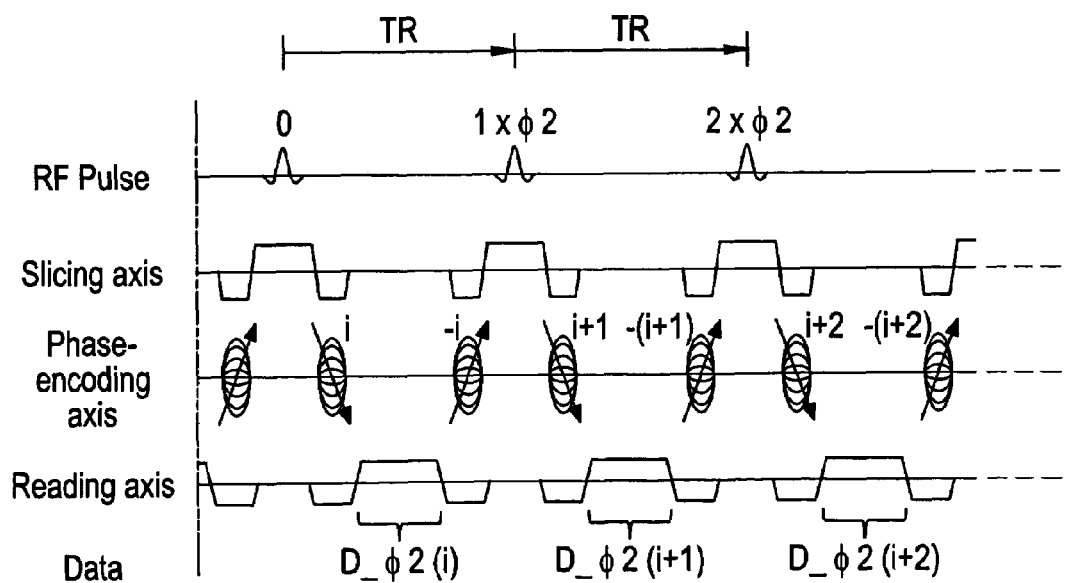
FIG. 11 is an explanatory diagram showing a second steady-state pulse sequence employed in the third embodiment.

At step C5, as shown in FIG. 11, data D_φ2 is acquired according to a steady-state pulse sequence specifying that the phase of an RF pulse is varied in order of 0, 1×φ2, 2×φ2, etc. Incidentally, FIG. 11 shows a normal steady-state pulse sequence. A steady-state pulse sequence determined in consideration of flow compensation may be substituted for the normal steady-state pulse sequence.

Data acquisition is then terminated.

FIG. 12 is a flowchart describing image construction employed in the third embodiment.

At step H1, the computer 107 determines φsum within the range of 0<φsum<π. φsum denotes a phase by which echoes represented by data D_φ2 are rotated.

Herein, φsum=φstep=π/4 shall be established.

At step H2, data Dw is produced according to Dw=D_φ1+exp(i×φsum)×D_φ2.

At step H3, an image Gw is constructed based on the data Dw.

At step H4, data Df is produced according to Df=D_φ1−exp(i×φsum)×D_φ2.

At step H5, an image Gf is constructed based on the data Df.

Image construction is then terminated.

FIG. 13 is an explanatory diagram concerning the aforesaid conceptual model adapted to the data D_φ1 acquired according to the steady-state pulse sequence specifying φ1=7π/4 as shown in FIG. 10.

The spin echo component of an echo Ew1 induced by water leads the gradient echo component thereof by 3π/4. The spin echo component of an echo Ef1 induced by fat leads the gradient echo component thereof by −3π/4.

FIG. 14 is an explanatory diagram concerning the aforesaid conceptual model adapted to the data D_φ2 acquired according to the steady-state pulse sequence specifying φ2=5π/4 as shown in FIG. 11.

The spin echo component of an echo Ew2 induced by water leads the gradient echo component thereof by π/4. The spin echo component of an echo Ef2 induced by fat leads the gradient echo component thereof by 3π/4.

As shown in FIG. 15, exp(i×φsum)×D_φ2 signifies that the echo Ew2 induced by water is rotated by φsum in order to produce an echo Ew2', and the echo Ef2 induced by fat is rotated by φsum in order to produce an echo Ef2'. In FIG. 15, φsum shall equal π/4.

Consequently, as shown in FIG. 16, data processing expressed as Dw=D_φ1+exp(i×φsum)×D_φ2 signifies that the echo Ew1 induced by water and the echo Ew2' are added up and the echo Ef1 induced by fat and the echo Ef2' are added up. Eventually, after the addition is completed, the resultant echo Ew induced by water is enhanced, and the resultant echo Ef induced by fat is suppressed.

On the other hand, data processing expressed as Df=D_φ1−exp(i×π/2)×D_φ2 signifies that the echo Ew2' is subtracted from the echo Ew1 induced by water and the echo Ef2' is subtracted from the echo Ef1 induced by fat. Eventually, after the subtraction is completed, the resultant echo Ew induced by water is suppressed and the resultant echo Ef induced by fat is enhanced.

As mentioned above, the third embodiment can construct a water component-enhanced/fat component-suppressed image Gw using data Dw and construct a fat component-enhanced/water component-suppressed image Gf using data Df.

Fourth Embodiment

The fourth embodiment is fundamentally identical to the third embodiment. φstep=π and φcenter=φfat shall be established. A magnetic field system shall offer a magnetic field strength of 1.5 T and a repetition time TR shall be set to 8.05 ms.

In this case, as shown in FIG. 17 and FIG. 18, m equals 1 and φfat equals π/2. Moreover, φ1 comes to 3π and φ2 comes to π/4.

As shown in FIG. 17, the aforesaid conceptual model is adapted to data D_φ1 acquired according to a steady-state pulse sequence specifying φ1=3π/4. The spin echo component of an echo Ew1 induced by water leads the gradient echo component thereof by −π/4. The spin echo component of an echo Ef1 induced by fat leads the gradient echo component thereof by −3π/4.

As shown in FIG. 18, the aforesaid conceptual model is adapted to data D_φ2 acquired according to a steady-state pulse sequence specifying φ2=π/4. The spin echo component of an echo Ew2 induced by water leads the gradient echo component thereof by −3π/4. The spin echo component of an echo Ef2 induced by fat leads the gradient echo component thereof by −5π/4.

As shown in FIG. 19, exp(i×φsum)×D_φ2 signifies that the echo Ew2 induced by water is rotated by φsum in order to produce an echo Ew2'. The echo Ef2 induced by fat is rotated by φsum in order to produce an echo Ef2'. In FIG. 19, φsum=φstep=π/4 shall be established.

As shown in FIG. 20, data processing expressed as Dw=D_φ1+exp(i×φsum)×D_φ2 signifies that the echo Ew1 induced by water and the echo Ew2' are added up and the echo Ef1 induced by fat and the echo Ef2' are added up. Consequently, after the addition is completed, the resultant echo Ew induced by water is enhanced and the resultant echo Ef induced by fat is suppressed.

On the other hand, data processing expressed as Df=D_φ1−exp(i×π/2)×D_φ2 signifies that the echo Ew2' is subtracted from the echo Ew1 induced by water and the echo Ef2' is subtracted from the echo Ef1 induced by fat. Consequently, after the subtraction is completed, the resultant echo Ew induced by water is suppressed and the resultant echo Ef induced by fat is enhanced.

As mentioned above, the fourth embodiment can construct a water component-enhanced/fat component-suppressed image Gw using the data Dw and a fat component-enhanced/water component-suppressed image Gf using the data Df.

Fifth Embodiment

The fifth embodiment is fundamentally identical to the third embodiment. A magnetic field system shall offer a magnetic field strength of 0.2 T, a repetition time Tr shall be set to 10 ms, φfat shall be set to π/2, and φcenter shall be set to π+φfat/2−φstep.

In this case, as shown in FIG. 21 and FIG. 22, φcenter equals 5π/4, φ1 equals 7π/4, and φ2 equals 3π/4.

As shown in FIG. 21, the aforesaid conceptual model is adapted to data D_φ1 acquired according to a steady-state pulse sequence specifying φ1=7π/4. The spin echo component of an echo Ew1 induced by water leads the gradient echo component thereof by 3π/4. The spin echo component of an echo Ef1 induced by fat leads the gradient echo component thereof by −3π/4.

As shown in FIG. 22, the aforesaid conceptual model is adapted to data D_φ2 acquired according to a steady-state pulse sequence specifying φ2=3π/4. The spin echo component of an echo Ew2 induced by water leads the gradient echo component thereof by −π/4. The spin echo component of an echo Ef2 induced by fat leads the gradient echo component thereof by −7π/4.

As shown in FIG. 23, exp(i×φsum)×D_φ2 signifies that the echo Ew2 induced by water is rotated by φsum in order to produce an echo Ew2', and the echo Ef2 induced by fat is rotated by φsum in order to produce an echo Ef2'. In FIG. 23, φsum=φstep=π/2 shall be established.

As shown in FIG. 24, data processing expressed as Dw=D_φ1+exp(i×φsum)×D_2 signifies that the echo Ew1 induced by water and the echo Ew2' are added up and the echo Ef1 induced by fat and the echo Ef2' are added up. Consequently, after the addition is completed, the resultant echo Ew induced by water is enhanced and the resultant echo Ef induced by fat is suppressed.

On the other hand, data processing expressed as Df=D_φ1−exp(i×π/2)×D_φ2 signifies that the echo Ew2' is subtracted from the echo Ew1 induced by water and the echo Ef2' is subtracted from the echo Ef1 induced by fat. Consequently, after the subtraction is completed, the resultant echo Ew induced by water is suppressed and the resultant echo Ef induced by fat is enhanced.

As mentioned above, the fifth embodiment can construct a water component-enhanced/fat component-suppressed image Fw using data Dw and a fat component-enhanced/water component-suppressed image Gf using data Df.

Sixth Embodiment

The sixth embodiment is fundamentally identical to the fourth embodiment. A magnetic field system shall offer a magnetic field strength of 1.5 T, a repetition time TR shall be set to 8.05 ms, φfat shall be set to π/2, φcenter shall be set to π, and φstep shall be set to 3π/4.

In this case, as shown in FIG. 25 and FIG. 26, φ1 equals 7π/4 and φ2 equals π/4.

As shown in FIG. 25, the aforesaid conceptual model is adapted to data D_φ1 acquired according to a steady-state pulse sequence specifying φ1=7π/4. The spin echo component of an echo Ew1 induced by water leads the gradient echo component thereof by $3\pi/4$. The spin echo component of an echo Ef1 induced by fat leads the gradient echo component thereof by $\pi/4$.

As shown in FIG. 26, the aforesaid conceptual model is adapted to data D__$\phi$2 acquired according to a steady-state pulse sequence specifying $\phi 2=\pi/4$. The spin echo component of an echo Ew2 induced by water leads the gradient echo component thereof by $-3\pi/4$. The spin echo component of an echo Ef2 induced by fat leads the gradient echo component thereof by $-5\pi/4$.

As shown in FIG. 27, $\exp(i\times\phi\text{sum})\times D\_\phi 2$ signifies that the echo Ew2 induced by water is rotated by $\phi$sum in order to produce an echo Ew2', and the echo Ef2 induced by fat is rotated by $\phi$sum in order to produce an echo Ef2'. In FIG. 27 $\phi\text{sum}=\phi\text{step}=3\pi/4$ shall be established.

As shown in FIG. 28, data processing expressed as $Dw=D\_\phi 1+\exp(i\times\phi\text{sum})\times D\_\phi 2$ signifies that the echo Ew1 induced by water and the echo Ew2' are added up and the echo Ef1 induced by fat and the echo Ef2' are added up. Consequently, after the addition is completed, the resultant echo Ew induced by water is enhanced and the resultant echo Ef induced by fat is suppressed.

On the other hand, data processing expressed as $Df=D\_\phi 1-\exp(i\times\pi/2)\times D\_+2$ signifies that the echo Ew2' is subtracted from the echo Ew1 induced by water and the echo Ef2' is subtracted from the echo Ef1 induced by fat. Consequently, after the subtraction is completed, the resultant echo Ew induced by water is suppressed and the resultant echo Ef induced by fat is enhanced.

As mentioned above, the sixth embodiment can construct a water component-enhanced/fat component-suppressed image Gw using data Dw and a fat component-enhanced/water component-suppressed image Gf using data Df.

Many widely different embodiments of the invention may be configured without departing from the spirit and the scope of the present invention. It should be understood that the present invention is not limited to the specific embodiments described in the specification, except as defined in the appended claims.

The invention claimed is:

1. An MR data acquisition method comprising:
   acquiring data D__$\phi$1 according to a steady-state pulse sequence specifying that the phase of an RF pulse is varied in order of 0, 1×$\phi$1, 2×$\phi$1, etc.;
   acquiring data D__$\phi$2 according to a steady-state pulse sequence specifying that the phase of an RF pulse is varied in order of 0, 1×$\phi$2, 2×$\phi$2, etc., wherein $\phi 1=\phi\text{center}+\phi\text{step}$ and $\phi 2=\phi\text{center}-\phi\text{step}$ are established on the assumption that $\phi$center denotes a center phase, that is, a phase difference associated with the center of the portion of a line graph indicating a decrease in a signal strength, and that a phase width, that is, the width of the portion of the line graph indicating the decrease in a signal strength is provided as 2×$\phi$step (where any of $0<\phi\text{center}<\pi$, $-\pi<\phi\text{center}<0$, $0<\phi\text{step}<\pi/2$, and $\pi/2<\phi\text{step}<\pi$ is met); and
   generating an image using data D__$\phi$1 and data D__$\phi$2.

2. An MR data acquisition method according to claim 1, wherein when $\phi\text{fat}=(2-TR/T\_\text{out}+2\times m)\times\pi$ is established on the assumption that m denotes an integer equal to or larger than 0 and meets $TR/(2\times T\_\text{out})-1<m<TR/(2\times T\_\text{out})$ where TR denotes a repetition time and T_out denotes the time during which spins in water and spins in fat are out of phase with each other due to chemical shifts, $\phi\text{center}=\phi\text{fat}/2+\phi\text{step}$ is established under the condition of $0<\phi\text{step}\leq\pi/2-|\pi-\phi\text{fat}|/2$.

3. An MR data acquisition method according to claim 1, wherein when $\phi\text{fat}-(2-TR/T\_\text{out}+2\times m)\times\pi$ is established on the assumption that m denotes an integer equal to or larger than 0 and meets $TR/(2\times T\_\text{out})-1<m<TR/(2\times T\_\text{out})$ where TR denotes a repetition time and T_out denotes the time during which spins in water and spins in fat are out of phase with each other due to chemical shifts, $\phi\text{center}+\phi\text{fat}/2+\phi\text{step}$ is established under the condition of $\phi\text{fat}/2\leq\phi\text{step}\leq\pi-\phi\text{fat}/2$ as long as $\phi\text{fat}\leq\pi$ is met, or $\phi\text{center}=\pi+\phi\text{fat}/2-\phi\text{step}$ is established under the condition of $\pi-\phi\text{fat}/2\leq\phi\text{step}\leq\phi\text{fat}/2$ as long as fata is met.

4. An MR data acquisition method according to claim 1, wherein when $\phi\text{fat}=(2-TR/T\_\text{out}+2\times m)\times\pi$ is established on the assumption that m denotes an integer equal to or larger than 0 and meets $TR/(2\times T\_\text{out})-1<m<TR/(2\times T\_\text{out})$ where TR denotes a repetition time and T_out denotes the time during which spins in water and spins in fat are out of phase with each other due to chemical shifts, $\phi\text{center}=\pi$ is established under the condition of $\pi/2=|\pi-\phi\text{fat}|/2\leq\phi\text{step}<\pi$.

5. An MR image construction method in accordance claim 1 wherein generating an image further comprises constructing an MR image Gw using data Dw, wherein data D__$\phi$1 and data D__$\phi$2 are synthesized with a phase value added to the data D__2 using $\phi$sum defined as $0<\phi\text{sum}<\pi$, the data Dw is produced according to $Dw=D\_\phi 1+\exp(i\times\phi\text{sum})\times D\_\phi 2$.

6. An MR data acquisition method according to claim 1 further comprising establishing $\phi\text{fat}=(2-TR/T\_\text{out}=\times m)\times\pi$ based on an assumption that m denotes an integer at least equal to 0 and meets $TR/(2\times T\_\text{out})-1<m<TR/(2\times T\_\text{out})$, wherein TR denotes a repetition time and T_out denotes a time during which spins in water and spins in fat are out of phase with each other due to chemical shifts, wherein $\phi$step is a function of $\phi$fat.

7. An MRI system comprising:
   a magnet configured to generate a substantially uniform magnetic field;
   a gradient field generator configured to generate gradients extending in different directions in the magnetic field;
   a radio frequency (RF) pulse generator configured to excite the magnetic field;
   a receiver configured to receive magnetic field magnetic resonance (MR) signals representative of an object; and
   a data acquisition device operationally coupled to said receiver, said data acquisition device configured to:
   determine when $\phi 1=\phi\text{center}+\phi\text{step}$ and $\phi 2=\phi\text{center}-\phi\text{step}$ are established, on the assumption that $\phi$center denotes a center phase, that is, a phase difference associated with the center of the portion of a line graph indicating a decrease in a signal strength, and that a phase width, that is, the width of the portion of the line graph indicating the decrease in a signal strength is provided as 2×$\phi$step (where any of $0<\phi\text{center}<\pi$, $-\pi<\phi\text{center}<0$, $0<\phi\text{step}<\pi/2$, and $\pi/2<\phi\text{step}<\pi$ is met);
   acquire data D__1 according to a steady-state pulse sequence specifying that the phase of an RF pulse is varied in order of 0, 1×$\phi$1, 2×$\phi$1, etc. when $\phi 1=\phi\text{center}+\phi\text{step}$ and $\phi 2=\phi\text{center}-\phi\text{step}$ are established; and
   acquire data D__2 according to a steady-state pulse sequence specifying that the phase of an RE pulse is varied in order of 0, 1×$\phi$2, 2×$\phi$2, etc. when $\phi 1=\phi\text{center}+\phi\text{step}$ and $\phi 2=\phi\text{center}-\phi\text{step}$ are established.

8. An MRI system according to claim 7, wherein:
   when $\phi\text{fat}=(2-TR/T\_\text{out}+2\times m)\times\pi$ is established on the assumption that m denotes an integer equal to or larger than 0 and meets $TR/(2\times T\_\text{out})-1<m<TR/(2\times T\_\text{out})$ where TR denotes a repetition time and T_out denotes the time during which spins in water and spins in fat are out of phase with each other due to chemical shifts, φcenter=φfat is established under the condition of $0 < \phi\text{step} \leq \pi/2 - |\pi - \phi\text{fat}|/2$.

9. An MRI system according to claim 7, wherein:

when $\phi\text{fat}=(2-TR/T\_out+2\times m)\times\pi$ is established on the assumption that m denotes an integer equal to or larger than 0 and meets $TR/(2\times T\_out)-1<m<TR/(2\times T\_out)$ where TR denotes a repetition time and T_out denotes the time during which spins in water and spins in fat are out of phase with each other due to chemical shifts, φcenter=φfat/2+φstep is established under the condition of $\phi\text{fat}/2 \leq \phi\text{step} \leq \pi - \phi\text{fat}/2$ as long as $\phi\text{fat} \leq \pi$ is met, or φcenter=π+φfat/2−φstep is established under the condition of $\pi - \phi\text{fat}/2 \leq \phi\text{step} \leq \phi\text{fat}/2$ as long as $\phi\text{fat} \leq \pi$ is met.

10. An MRI system according to claim 9, wherein φstep=π/2 and φcenter=φfat/2+π/2 are established.

11. An MRI system according to claim 7, wherein:

when $\phi\text{fat}=(2-TR/T\_out=2\times m)\times\pi$ is established on the assumption that m denotes an integer equal to or larger than 0 and meets $TR/(2\times T\_out)-1<m<TR/(2\times T\_out)$ where TR denotes a repetition time and T_out denotes the time during which spins in water and spins in fat are out of phase with each other due to chemical shifts, φcenter=π is established under the condition of $\pi/2 + |\pi - \phi\text{fat}|/2 \geq \phi\text{step} < \pi$.

12. An MRI system according to claim 7, further comprising an image construction device for constructing an MR image Gw using data Dw, wherein when data D_φ1 and data D_φ2 are synthesized with a phase value added to the data D_φ2 using φsum defined as 0<φsum<π, the data Dw is produced according to Dw=D_φ1+exp(i×φsum)×D_φ2.

13. An MRI system according to claim 12, wherein φsum=φstep is established.

14. An MH system according to claim 7, further comprising an image construction device for constructing an MR image Gf using data Df, wherein when data D_1 and D_2 are synthesized with a phase value added to the data D_φ2 using φsum defined as 0<φsum<π, the data Df is produced according to Df=D_φ1−exp(i×φsum)×D_φ2.

15. An MRI system according to claim 14, wherein φsum=φstep is established.

16. An MRI system according to claim 7, wherein φfat=(2−TR/T_out+2×m)×π is established on an assumption that m denotes an integer at least equal to 0 and meets TR/(2×T_out)−1<m<TR/(2×T_out), wherein TR denotes a repetition time and T_out denotes a time during which spins in water and spins in fat are out of phase with each other due to chemical shifts, wherein φstep is a function of φfat.

* * * * *